(12) United States Patent
Koyama

(10) Patent No.: US 7,982,222 B2
(45) Date of Patent: Jul. 19, 2011

(54) EL DISPLAY DEVICE AND ELECTRONIC DEVICE

(75) Inventor: Jun Koyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 504 days.

(21) Appl. No.: 12/081,150

(22) Filed: Apr. 11, 2008

(65) Prior Publication Data

US 2008/0265786 A1    Oct. 30, 2008

Related U.S. Application Data

(60) Continuation of application No. 10/848,147, filed on May 19, 2004, now Pat. No. 7,358,531, which is a division of application No. 10/093,738, filed on Mar. 11, 2002, now Pat. No. 6,777,887, which is a division of application No. 09/597,399, filed on Jun. 21, 2000, now Pat. No. 6,774,574.

(30) Foreign Application Priority Data

Jun. 23, 1999  (JP) .................................. 11-176521

(51) Int. Cl.
  *H01L 27/14* (2006.01)
(52) U.S. Cl. ................. 257/72; 313/506; 315/169.3
(58) Field of Classification Search .............. 257/72, 257/88, 103; 313/498, 506; 315/169.1, 169.2, 315/169.3; 345/45, 76
See application file for complete search history.

(56) References Cited

U.S. PATENT DOCUMENTS

| 4,005,471 | A | 1/1977 | Magdo et al. |
| 4,356,429 | A | 10/1982 | Tang |
| 4,539,507 | A | 9/1985 | VanSlyke et al. |
| 4,720,432 | A | 1/1988 | VanSlyke et al. |
| 4,769,292 | A | 9/1988 | Tang et al. |
| 4,885,211 | A | 12/1989 | Tang et al. |
| 4,950,950 | A | 8/1990 | Perry et al. |
| 5,047,687 | A | 9/1991 | VanSlyke |
| 5,059,861 | A | 10/1991 | Littman et al. |

(Continued)

FOREIGN PATENT DOCUMENTS

CN    1216135    5/1999

(Continued)

OTHER PUBLICATIONS

Shimokawa et al., "Characterization of High-Efficiency Cast-Si Solar Cell Wafers by MBIC Measurement," Japanese Journal of Applied Physics, vol. 27, No. 5, May 1988, pp. 751-758.

(Continued)

*Primary Examiner* — Thuy Vinh Tran
(74) *Attorney, Agent, or Firm* — Robinson Intellectual Property Law Office, P.C.; Eric J. Robinson

(57) ABSTRACT

An EL display device capable of producing a vivid multi-gradation color display, and an electronic device having the EL display device. An electric current supplied to an EL element is controlled by providing a resistor between a current control TFT and the EL element formed in a pixel, the resistor having a resistance higher than the on-resistance of the current control TFT. The gradation display is executed by a time-division drive system which controls the emission and non-emission of light of the EL element by time, preventing the effect caused by a dispersion in the characteristics of the current control TFT.

30 Claims, 18 Drawing Sheets

U.S. PATENT DOCUMENTS

| | | | |
|---|---|---|---|
| 5,059,862 A | 10/1991 | VanSlyke et al. | |
| 5,061,617 A | 10/1991 | Maskasky | |
| 5,073,446 A | 12/1991 | Scozzafava et al. | |
| 5,095,248 A | 3/1992 | Sato | |
| 5,151,629 A | 9/1992 | VanSlyke | |
| 5,294,869 A | 3/1994 | Tang et al. | |
| 5,294,870 A | 3/1994 | Tang et al. | |
| 5,302,966 A | 4/1994 | Stewart | |
| 5,525,867 A | 6/1996 | Williams | |
| 5,587,329 A * | 12/1996 | Hseuh et al. | 438/30 |
| 5,640,067 A | 6/1997 | Yamauchi et al. | |
| 5,684,365 A * | 11/1997 | Tang et al. | 315/169.3 |
| 5,714,968 A | 2/1998 | Ikeda | |
| 5,717,240 A | 2/1998 | Kuriyama et al. | |
| 5,793,342 A | 8/1998 | Rhoads | |
| 5,839,456 A | 11/1998 | Han | |
| 5,882,761 A | 3/1999 | Kawami et al. | |
| 5,929,464 A | 7/1999 | Yamazaki et al. | |
| 5,932,892 A * | 8/1999 | Hseuh et al. | 257/59 |
| 5,932,917 A | 8/1999 | Miura | |
| 5,940,053 A | 8/1999 | Ikeda | |
| 5,962,962 A | 10/1999 | Fujita et al. | |
| 5,990,629 A | 11/1999 | Yamada et al. | |
| 6,011,529 A | 1/2000 | Ikeda | |
| 6,084,579 A | 7/2000 | Hirano | |
| 6,097,360 A | 8/2000 | Holloman | |
| 6,100,860 A | 8/2000 | Takayama et al. | |
| 6,104,041 A | 8/2000 | Hsueh et al. | |
| 6,147,451 A | 11/2000 | Shibata et al. | |
| 6,175,345 B1 | 1/2001 | Kuribayashi et al. | |
| 6,194,837 B1 | 2/2001 | Ozawa | |
| 6,204,610 B1 | 3/2001 | Komiya | |
| 6,215,244 B1 | 4/2001 | Kuribayashi et al. | |
| 6,246,179 B1 | 6/2001 | Yamada | |
| 6,261,705 B1 | 7/2001 | Tanikawa et al. | |
| 6,268,842 B1 | 7/2001 | Yamazaki et al. | |
| 6,281,634 B1 | 8/2001 | Yokoyama | |
| 6,288,696 B1 | 9/2001 | Holloman | |
| 6,303,963 B1 | 10/2001 | Ohtani et al. | |
| 6,335,716 B1 | 1/2002 | Yamazaki et al. | |
| 6,366,025 B1 | 4/2002 | Yamada | |
| 6,369,507 B1 | 4/2002 | Arai | |
| 6,373,455 B1 | 4/2002 | Kuribayashi et al. | |
| 6,380,007 B1 | 4/2002 | Koyama | |
| 6,380,672 B1 * | 4/2002 | Yudasaka | 313/504 |
| 6,380,687 B1 | 4/2002 | Yamazaki | |
| 6,392,628 B1 | 5/2002 | Yamazaki et al. | |
| 6,452,341 B1 | 9/2002 | Yamauchi et al. | |
| 6,469,317 B1 | 10/2002 | Yamazaki et al. | |
| 6,483,484 B1 | 11/2002 | Yamazaki et al. | |
| 6,518,941 B1 | 2/2003 | Kimura | |
| 6,518,962 B2 | 2/2003 | Kimura et al. | |
| 6,597,349 B1 | 7/2003 | Koyama et al. | |
| 6,774,574 B1 | 8/2004 | Koyama | |
| 6,777,887 B2 | 8/2004 | Koyama | |
| 7,236,164 B2 | 6/2007 | Kimura | |
| 7,358,531 B2 | 4/2008 | Koyama | |
| 7,362,322 B2 | 4/2008 | Kimura et al. | |
| 2002/0079484 A1 | 6/2002 | Yamazaki et al. | |
| 2002/0097363 A1* | 7/2002 | Yudasaka | 349/138 |
| 2005/0041122 A1 | 2/2005 | Yamazaki et al. | |
| 2008/0180421 A1* | 7/2008 | Yudasaka | 345/204 |
| 2008/0265786 A1 | 10/2008 | Koyama | |

FOREIGN PATENT DOCUMENTS

| | | |
|---|---|---|
| EP | 0545363 A | 6/1993 |
| EP | 0 717 445 | 6/1996 |
| EP | 0 717 446 | 6/1996 |
| EP | 0 776 147 | 5/1997 |
| EP | 0 781 075 | 6/1997 |
| EP | 0878789 A | 11/1998 |
| EP | 0883191 A | 12/1998 |
| EP | 0923067 A | 6/1999 |
| EP | 0938074 A | 8/1999 |
| EP | 0949603 A | 10/1999 |
| EP | 1063630 A | 12/2000 |
| JP | 59-128581 | 7/1984 |
| JP | 59-128581 A | 7/1984 |
| JP | 61-095568 A | 5/1986 |
| JP | 62-090260 | 4/1987 |
| JP | 02-280379 A | 11/1990 |
| JP | 03-165491 A | 7/1991 |
| JP | 04-161984 A | 6/1992 |
| JP | 05-291517 A | 11/1993 |
| JP | 07-235645 A | 9/1995 |
| JP | 08-054835 A | 2/1996 |
| JP | 8-078159 | 3/1996 |
| JP | 8-234683 | 9/1996 |
| JP | 8-241048 | 9/1996 |
| JP | 09-016123 A | 1/1997 |
| JP | 9-148066 | 6/1997 |
| JP | 09-305139 A | 11/1997 |
| JP | 10-065109 A | 3/1998 |
| JP | 10-189525 | 7/1998 |
| JP | 10-214042 | 8/1998 |
| JP | 10-214060 | 8/1998 |
| JP | 10-232649 | 9/1998 |
| JP | 10-247735 | 9/1998 |
| JP | 10-294280 | 11/1998 |
| JP | 10-312173 | 11/1998 |
| JP | 10-319907 A | 12/1998 |
| JP | 10-319909 A | 12/1998 |
| JP | 11-003048 A | 1/1999 |
| JP | 11-054268 | 2/1999 |
| JP | 11-054434 A | 2/1999 |
| JP | 11-073158 A | 3/1999 |
| JP | 11-143379 A | 5/1999 |
| JP | 11-167373 A | 6/1999 |
| JP | 11-191628 | 7/1999 |
| JP | 11-345767 | 12/1999 |
| JP | 11-354442 | 12/1999 |
| JP | 2000-276075 A | 10/2000 |
| JP | 2001-005426 A | 1/2001 |
| JP | 2002-507773 A | 3/2002 |
| WO | WO 98/33165 | 7/1998 |
| WO | WO-98/40871 A | 9/1998 |
| WO | WO 98/48403 | 10/1998 |
| WO | WO 99/38148 | 7/1999 |
| WO | WO-99/48079 | 9/1999 |

OTHER PUBLICATIONS

European Search Report (00113394) dated May 27, 2002.

S. Moniruzzaman et al., "Structure of polycrystalline silicon films deposited at low temperature by plasma CvVD on substrates exposed to different plasma," Thin Solid Films, vol. 337, pp. 27-31, 1999.

G. Fortunato, "Polycrystalline silicon thin-film transistors: A continuous evolving technology," Thin Solid Films, vol. 296, pp. 82-90, 1997.

Office Action (Application No. 200810091988.1) Dated Jun. 12, 2009.

* cited by examiner

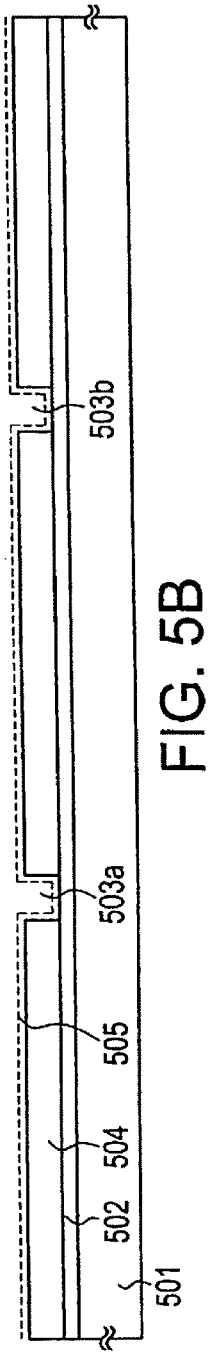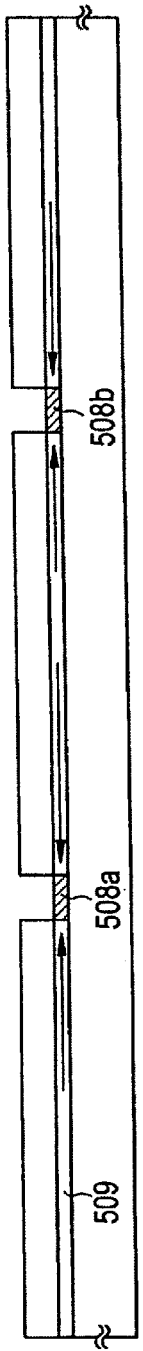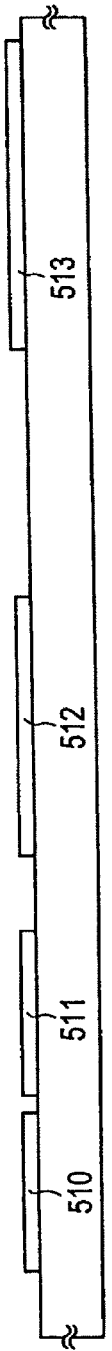

STEP OF ADDING P-TYPE IMPURITY ELEMENT

STEP OF ADDING N-TYPE IMPURITY ELEMENT

ACTIVATION STEP

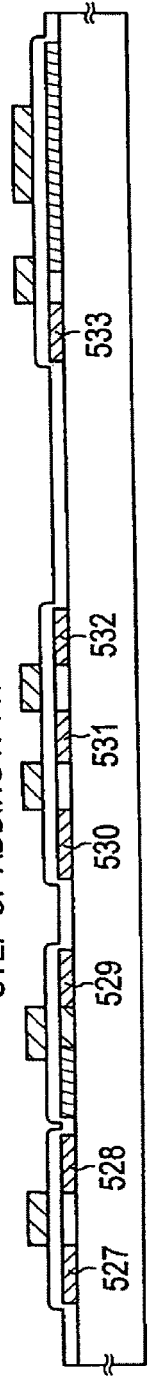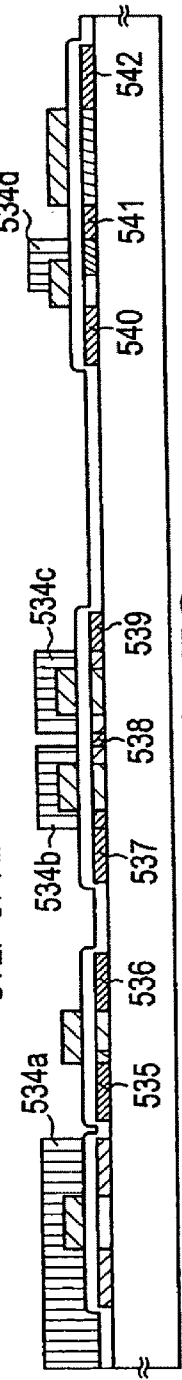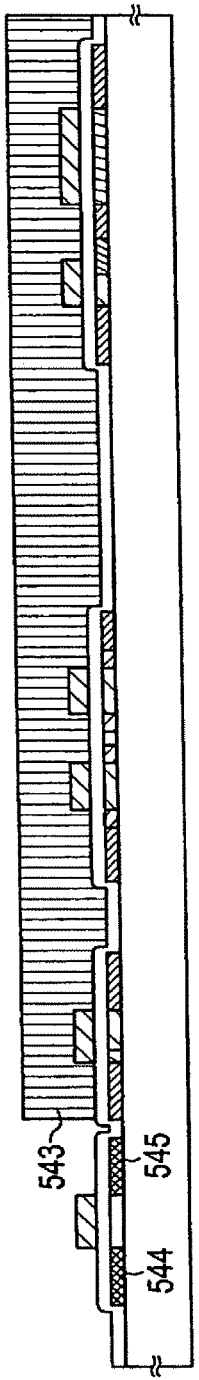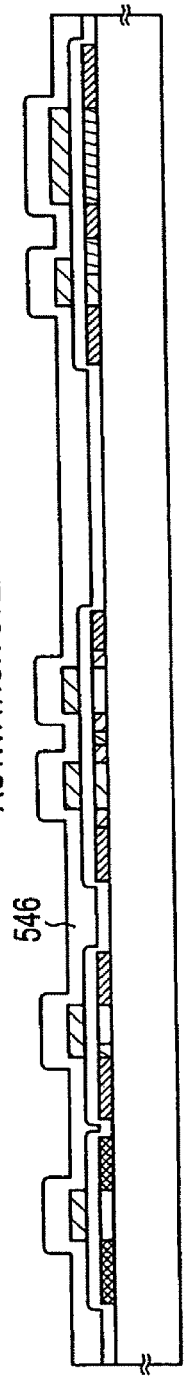

I-V CHARACTERISTIC

L-J CHARACTERISTIC

EL DISPLAY DEVICE AND ELECTRONIC DEVICE

BACKGROUND OF THE INVENTION

1. Field of the Invention

The present invention relates to an EL (electroluminescence) display device obtained by fabricating semiconductor elements (elements formed by using a thin semiconductor film) on a substrate and to an electronic device having the EL display device as a display unit.

2. Prior Art

Technology has been greatly advanced in recent years for forming TFTs on a substrate, and attempts have been made to develop an active matrix-type display device. In particular, TFTs using a polysilicon film exhibit a higher electric-field mobility (also called mobility) than that of the conventional TFTs using an amorphous silicon film, and make it possible to accomplish a high-speed operation. This makes it possible to control the pixels, which has heretofore been done by a drive circuit outside the substrate, by using a drive circuit formed on the same substrate as the pixels.

The active matrix-type display device is drawing attention owing it its advantages such as a decrease in the cost of production, a decrease in the size of the display device, an increase in the yield and a decrease in the throughput, as a result of fabricating various circuits and elements on the same substrate.

The active matrix-type EL display devices have heretofore been employing pixels of a structure that is generally as shown in FIG. 3. In FIG. 3, reference numeral 301 denotes a TFT (hereinafter referred to as switching TFT) that works as a switching element, 302 denotes a TFT (hereinafter referred to as current control TFT) working as an element (current control element) for controlling the current supplied to an EL element 303, and 304 denotes a capacitor (holding capacity). The switching TFT 301 is connected to a gate wiring 305 and to a source wiring (data wiring) 306. The drain of the current control TFT 302 is connected to the EL element 303, and the source thereof is connected to a current feeder line 307.

When the gate wiring 305 is selected, the gate of the switching TFT 301 is opened, a data signal of the source wiring 306 is accumulated in the capacitor 304, and the gate of the current control TFT 302 is opened. After the gate of the switching TFT 301 is closed, the gate of the current control TFT 302 remains opened due to the electric charge accumulated in the capacitor 304 and, during this period, the EL element 303 emits light. The amount of light emitted by the EL element 303 varies depending on the amount of electric current that flows.

Here, the amount of current supplied to the EL element 303 is controlled by a gate voltage of the current control TFT 302 as shown in FIG. 4.

FIG. 4(A) is a graph illustrating transistor characteristics of the current control TFT, wherein a curve 401 represents Id–Vg characteristics (or an Id–Vg curve), Id represents a drain current and Vg represents a gate voltage. From this graph, it is possible to know the amount of current that flows relative to any gate voltage.

Usually, the EL element is driven by utilizing the Id–Vg characteristics over a region surrounded by a dotted line 402. FIG. 4(B) is a view illustrating the region surrounded by 402 on an enlarged scale.

In FIG. 4(B), the hatched region is called sub-threshold region. In practice, this region has a gate voltage close to or lower than the threshold voltage (Vth) and where the drain current exponentially varies depending upon a change in the gate voltage. In this region, the current is controlled based on the gate voltage.

The data signal input to the pixel as the switching TFT 301 is opened is, first, accumulated in the capacitor 304 and directly serves as a gate voltage for the current control TFT 302. Here, the drain current is determined for the gate voltage at a ratio of 1 to 1 in compliance with the Id–Vg characteristics shown in FIG. 4(A). That is, a predetermined current flows through the EL element 303 depending on the data signal, and the EL element 303 emits light in an amount corresponding to the amount of current.

Thus, the amount of light emitted by the EL element is controlled by the data signal, and the gradation display is accomplished by controlling the amount of light that is emitted. This system is a so-called analog gradation; i.e., the gradation display is accomplished relying on a change in the amplitude of the signal.

However, the analog gradation system has a defect that it is very susceptible to dispersion in the characteristics of the TFTs. For example, considered below is a case where a switching TFT that would exhibit the same gradation has ID–Vg characteristics different from those of a switching TFT of the neighboring pixel (generally shifted toward the positive side or the negative side).

In this case, the drain currents flowing into the switching TFTs vary depending upon the degree of dispersion, and different gate voltages are applied to the current control TFTs of the pixels. That is different currents flow into the EL elements and, as a result, light is emitted in different amounts making it no longer possible to accomplish the same gradation display.

Further, even when the same gate voltage is applied to the current control TFTs of the pixels, the same drain current cannot be produced if there is a dispersion in the Id–Vg characteristics of the current control TFTs. As will be obvious from FIG. 4(A), further, since use is made of the region where the drain current exponentially changes relative to the change in the gate voltage, even a slight difference in the Id–Vg characteristics results in a large change in the amount of current despite an equal gate voltage is applied. Then, the amount of light emitted by the EL elements greatly varies among the neighboring pixels.

In practice, the situation becomes more severe due to synergistic effect of dispersion of both the switching TFTs and the current control TFTs. Thus, the analog gradation system is very susceptible to the dispersion in the characteristics of the TFTs, hindering the attempt for realizing the multi-color active matrix EL display device.

SUMMARY OF THE INVENTION

The present invention was accomplished in view of the above-mentioned problems, and provides an active matrix-type EL display device capable of producing a vivid multi-gradation color display. The invention further provides an electronic device of high performance using the active matrix-type EL display device as a display unit.

The present applicant has discovered the fact that the problems of the analog gradation system stem from the dispersion in the characteristics of the current control TFTs that control the current flowing into the EL elements and from the dispersion in the on-resistance of the current control TFTs. Here, the on-resistance is a value obtained by dividing the drain voltage of the TFT by the drain current flowing at that moment.

That is, the on-resistance varies among the current control TFTs and, hence, different currents (drain currents) flow even under the same condition, making it difficult to obtain a desired gradation.

According to this invention, therefore, a resistor (R) is connected in series between the drain of the current control TFT and the EL element to control the amount of current supplied from the current control TFT to the EL element. For this purpose, it is necessary to provide a resistor having a resistance very larger than the on-resistance of the current control TFT. The resistance may be selected over a range of from 1 kΩ to 50 MΩ (preferably, from 10 kΩ to 10 MΩ and, more preferably, from 50 kΩ to 1 MΩ).

In carrying out the invention, further, the amount of current flowing into the EL element is determined by the resistance of the resistor (R), and the supplied current becomes constant at all times. That is, the invention does not use the analog gradation system that produces the gradation display by controlling the current value that is done by the prior art. The invention therefore uses the gradation display of the time-division system (hereinafter referred to as time-division gradation) using the current control TFTs simply as switching elements for supplying electric current.

Concretely speaking, the time-division gradation display is accomplished in a manner as described below. Described here is a case of full-color display of 256 gradations (16,770,000 colors) based on the 8-bit digital drive system.

First, a picture frame is divided into eight sub-frames. Here, a period for inputting data to all pixels of the display region is called a frame. In an ordinary EL display, the oscillation frequency is 60 Hz, i.e., 60 frames are formed in a second. When the number of frames per a second becomes smaller than this value, flickering of the picture becomes conspicuous. Further, frames divided into a plural number from a frame are called sub-frames.

Each sub-frame can be divided into an address period (Ta) and a sustain period (Ts). The address period stands for a time necessary for inputting data to all pixels during a sub-frame period, and the sustain period (or turn-on period) stands for a period in which the EL element emits light (FIG. 10).

Here, a first sub-frame is denoted by SF1, and the second sub-frame to the eighth sub-frame are denoted by SF2 to SF8. The address period (Ta) remains constant from SF1 through up to SF8. The sustain periods (Ts) of SF1 to SF8 are denoted by Ts1 to Ts8.

At this moment, the sustain periods are so set that Ts1:Ts2:Ts3:Ts4:Ts5:Ts6:Ts7:Ts8=1:1/2:1/4:1/8:1/16:1/32:1/64:1/128. Here, SF1 to SF8 may appear in any order. Any desired gradation display can be accomplished out of 256 gradations relying on the combinations of the sustain periods.

First, no voltage (for not to select) is applied to the opposing electrode (the one of the side not connected to the TFT, and is usually a cathode) of the EL element of the pixel, and the data signal is input to all of the pixels without causing EL elements to emit light. This period is an address period. When the data is input to all pixels to end the address period, a voltage is applied to the opposing electrodes (selected) so that the EL elements emit light simultaneously. This period is a sustain period. The period for emitting light (for turning the pixel on) is any one of the periods Ts1 to Ts8. It is, here, presumed that a predetermined pixel is turned on for the period Ts8.

The time enters into the address period again and, then, enters into the sustain period after the data signal is input to all pixels. In this case, any one of Ts1 to Ts7 is the sustain period. Here, a predetermined pixel is turned on for the period Ts7.

Hereinafter, the same operation is repeated for the remaining six sub-frames, the sustain periods are successively set like Ts6, Ts5, . . . , Ts1, and the predetermined pixels are turned on in the respective sub-frames.

When eight sub-frames have appeared, it means an end of a frame. In this case, the gradation of the pixel is controlled by adding up the sustain periods. When, for example, Ts1 and Ts2 are selected, the luminance of 75% can be expressed out of the total light of 100%. When Ts3, Ts5 and Ts8 are selected, 16% of the luminance can be expressed.

In the foregoing was described the case of 256 gradations. It is, however, also allowable to effect any other gradation display.

To effect the display of a gradation ($2^n$ gradation) of n bits (n is an integer of not smaller than 2), first, a frame is divided into n sub-frames (SF1, SF2, SF3, . . . , SF(n−1), SF(n)) to correspond to the gradation of n bits. As the gradation increases, the frame must be divided into an increased number, and the drive circuits must be driven at a high frequency.

These n pieces of sub-frames are separated into address periods (Ta) and sustain periods (Ts). That is, the address periods and the sustain periods are selected by either applying or not applying a voltage to the opposing electrode common to all EL elements.

The sustain periods (the sustain periods corresponding to SF1, SF2, SF3, - - -, SF(n−1), SF(n)) of n sub-frames are so processed that $Ts1:Ts2:Ts3: - - - :Ts(n-1):Ts(n) = 2^0:2^{-1}:2^{-2}: - - - 2^{-(n-2)}:2^{-(n-1)}$.

In this state, the pixels are successively selected in any sub-frame (strictly, switching TFTs of the pixels are selected), and a predetermined gate voltage (corresponding to data signal) is applied to the gate electrodes of the current control TFTs. At this moment, the EL element of the pixel that has received a data signal which renders the current control TFT to be conductive, emits light for the sustain period assigned to the sub-frame after the address period has been finished. That is, a predetermined pixel is turned on.

This operation is repeated for all n sub-frames to control the gradation of the pixels by adding up the sustain periods. Therefore, if attention is given to a certain pixel, the gradation of the pixel is controlled depending upon how long period the pixel is turned on by the sub-frames (depending upon how many sustain periods it has passed through).

As described above, the feature of the present invention resides on executing the time-division gradation display by using the active matrix-type EL display device, and by providing a resistor (R) between the drain of the current control TFT and the EL element to set constant the current that flows through the EL element at all times. This constitution makes it possible to prevent defect in the gradation caused by dispersion in the characteristics of the TFTs.

BRIEF DESCRIPTION OF THE DRAWINGS

Preferred embodiments of the present invention will be described in detail based on the following figures, wherein:

FIGS. 5(A) to 5(E) are views illustrating the steps for fabricating the EL display device;

FIGS. 7(A) to 7(D) are views illustrating the steps for fabricating the EL display device;

DESCRIPTION OF THE PREFERRED EMBODIMENTS

Figure 1A:
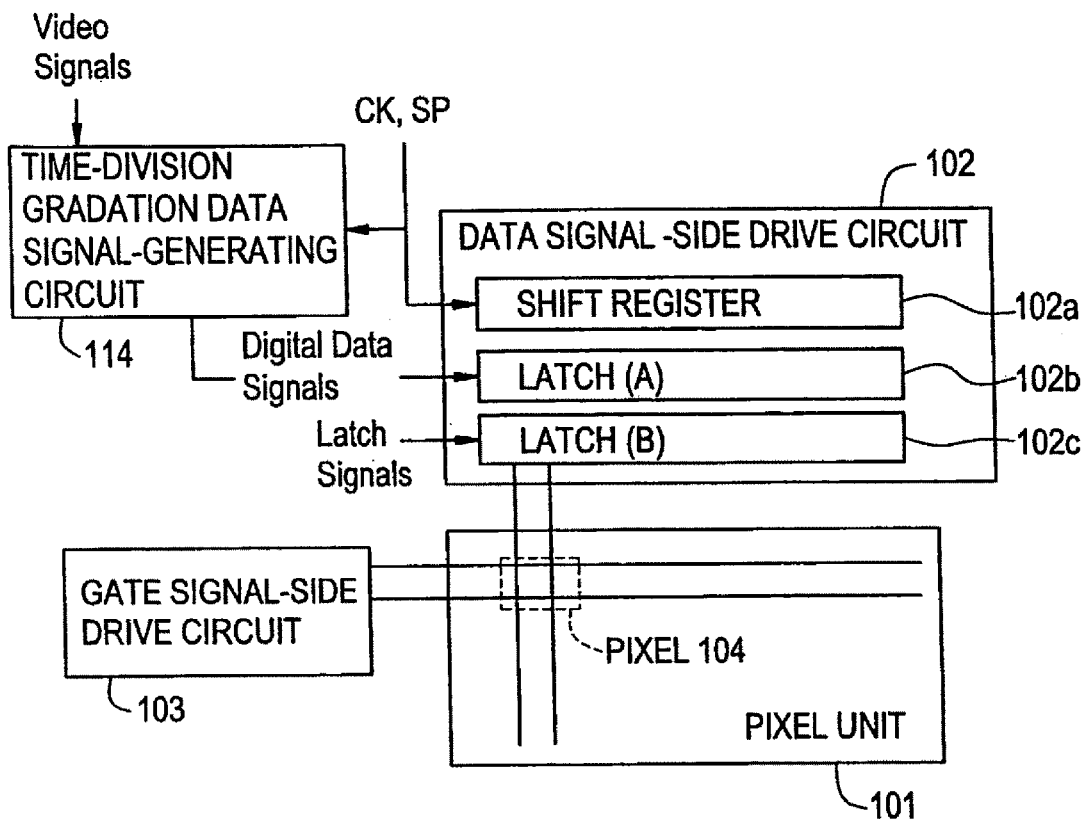
FIGS. 1(A) and 1(B) are diagrams illustrating the constitution of an EL display device.

FIG. 1(A) illustrates the circuit constitution of an active matrix-type EL display device of the present invention. The active matrix-type EL display device of FIG. 1(A) includes a pixel unit 101, a data signal-side drive circuit 102 and a gate signal-side drive circuit 103 arranged in the peripheries of the pixel unit, which are constituted by TFTs formed on a substrate. Here, either the data signal-side drive circuit or the gate signal-side drive circuit may be formed in a pair with the pixel unit sandwiched therebetween.

The data signal-side drive circuit 102 basically includes a shift register 102a, a latch (A) 102b, and a latch (B) 102c. The shift register 102a receives clock pulses (CK) and a start pulse (SP), the latch (A) 102b receives digital data signals, and the latch (B) 102c receives latch signals.

In this invention, the data signal input to the pixel unit is a digital signal. Since the invention does not rely upon the voltage gradation display unlike the liquid crystal display device, a digital data signal having data "0" or "1" is directly input to the pixel unit.

Figure 1B:
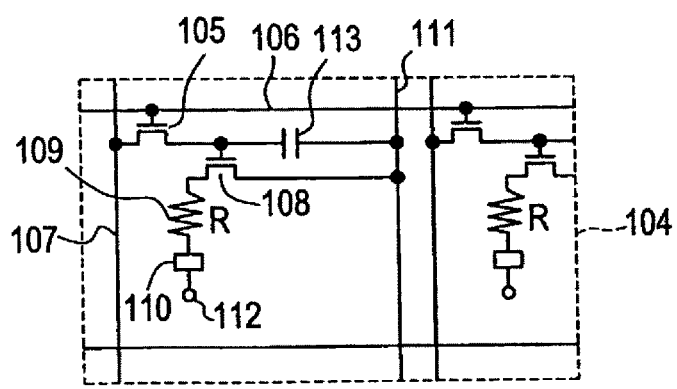

In the pixel unit 101 are arranged plural pixels 104 in the form of a matrix. FIG. 1(B) is a diagram illustrating the pixel 104 on an enlarged scale. In FIG. 1(B), reference numeral 105 denotes a switching TFT which is connected to a gate wiring 106 that receives a gate signal and to a data wiring (also referred to as source wiring) 107 that receives a data signal.

Reference numeral 108 denotes a current control TFT of which the gate is connected to the drain of the switching TFT 105. The drain of the current control TFT 108 is connected to an EL element 110 via a resistor 109, and the source thereof is connected to a current feeder line 111. The EL element 110 includes an anode (pixel electrode) connected to the current control TFT 108 and a cathode (opposing electrode) opposing the anode sandwiching the EL layer therebetween, the cathode being connected to a predetermined power source 112.

The resistor 109 may be the one that exhibits a resistance very larger than the on-resistance of the current control TFT 108, and has no limitation on the structure thereof. It is desired to use a semiconductor layer having a high resistance since it facilitates the formation.

Further, a capacitor 113 is provided for holding a gate voltage of the current control TFT 108 when the switching TFT 105 has not been selected (turned off). The capacitor 113 is connected to the drain of the switching TFT 105 and to the current feeder line 111.

The digital data signal input to the pixel unit is formed by a time-division gradation data signal generating circuit 114. This circuit converts video signals (signals including picture data) which are analog signals or digital signals into digital data signals for executing the time-division gradation, and further generates timing pulses necessary for the time-division gradation display.

Typically, the time-division gradation data signal-generating circuit 114 includes means for dividing a frame into n sub-frames depending upon the gradation of n bits (n is an integer of not smaller than 2), means for selecting the address periods and the sustain periods in n sub-frames, and means for so setting the sustain periods that $Ts1:Ts2:Ts3: ---:Ts(n-1):Ts(n)=2^0:2^{-1}:2^{-2}: ---:2^{-(n-2)}:2^{-(n-1)}$.

The time division gradation data signal-generating circuit 114 may be provided on the outer side of the EL display device of the invention. In this case, the digital data signals that are formed are input to the EL display device of the invention. Accordingly, the electronic device having the EL display device of the invention as a display unit, includes the EL display device of the invention and the time-division gradation data signal-generating circuit as separate components.

Further, the time-division gradation data signal-generating circuit 114 may be mounted in the form of an IC chip on the EL display device of the invention. In this case, the digital data signals formed by the IC chip are input to the EL display device of the invention. In this case, the electronic device having the EL display device of the invention as a display unit, includes, as a component, the EL display device of the invention on which is mounted an IC chip that includes the time-division gradation data signal-generating circuit.

Finally, further, the time-division gradation data signal-generating circuit 114 can be formed by TFTs on the same substrate as the pixel unit 104, data signal-side drive circuit 102 and gate signal-side drive circuit 103. Here, everything can be processed on the substrate if video signals including picture data are input to the EL display device. In this case, further, the electronic device having the EL display device of the invention as a display unit has the time-division gradation data-generating circuit that is incorporated in the EL display device, making it possible to decrease the size of the electronic device.

Figure 2:
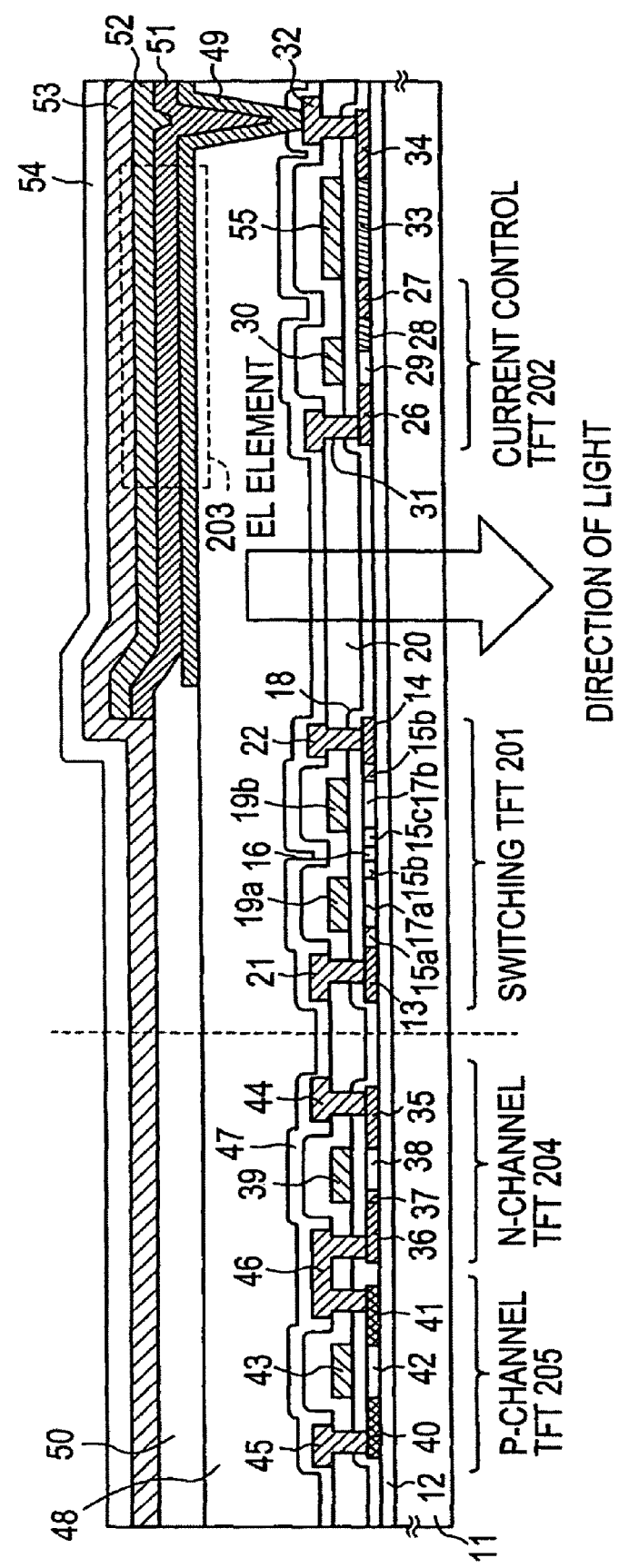
FIG. 2 is a view illustrating, in cross section, the structure of the EL display device.
Figure 3:
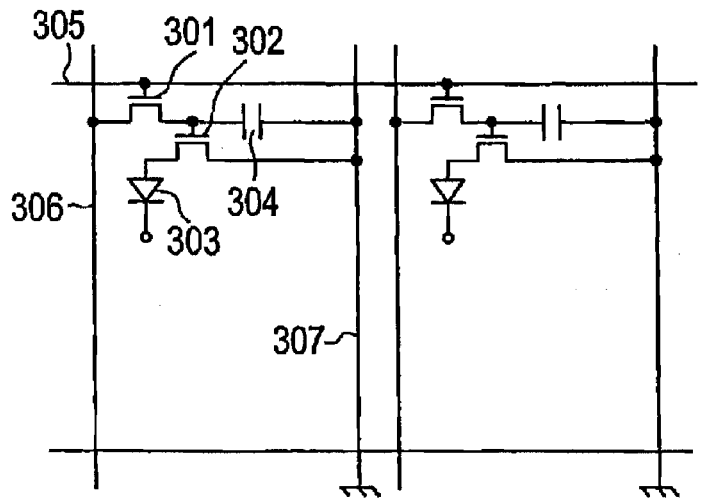
FIG. 3 is a diagram illustrating the constitution of a pixel portion in a conventional EL display device.
Figure 4A:
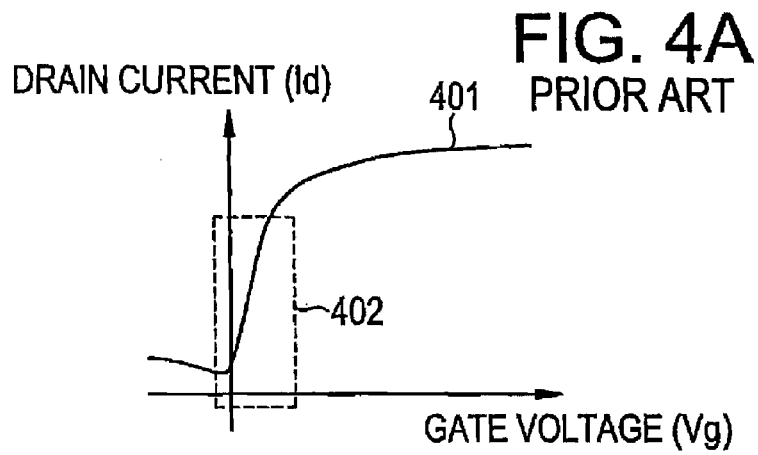
FIGS. 4(A) and 4(B) are diagrams illustrating TFT characteristics employed by an analog gradation system.
Figure 4B:
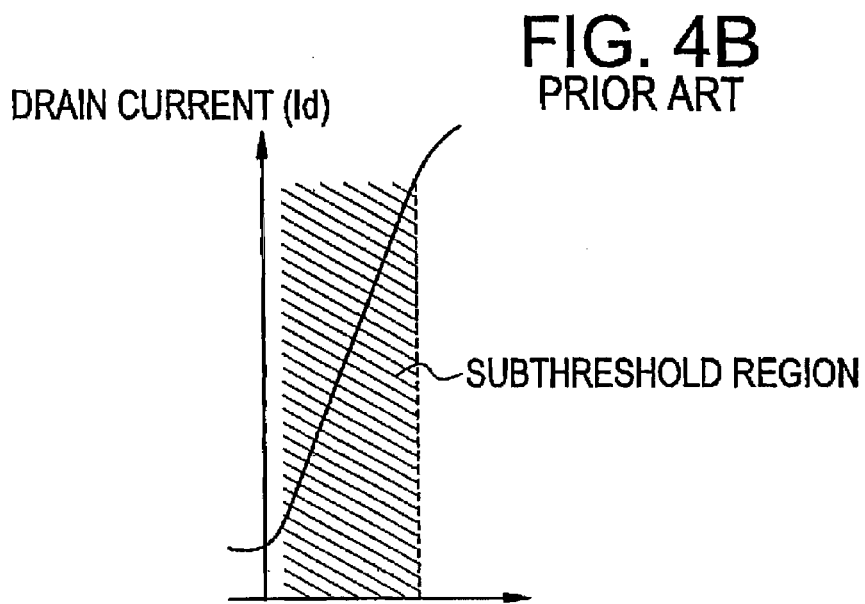

FIG. 2 is a sectional view schematically illustrating the structure of the active matrix-type EL display device of the invention.

In FIG. 2, reference numeral 11 denotes a substrate, and 12 denotes an insulating film that serves as an underlayer (hereinafter referred to as underlayer film).

As the substrate 11, there can be used a light-transmitting substrate and, typically, a glass substrate, a quartz substrate, a glass ceramic substrate or a crystallized glass substrate. The substrate, however, must be capable of withstanding a high temperature of during the production processing.

The underlying film 12 may not be provided in the case of the quartz substrate though it is effective for a substrate that contains mobile ions or for a substrate that has an electrically conducting property. The underlying film 12 may be an insulating film containing silicon. In this specification, the "insulating film containing silicon" concretely stands for an insulating film such as a silicon oxide film, a silicon nitride film or a silicon oxynitride film (SiOxNy: x and y are integers) containing oxygen or nitrogen at a predetermined ratio with respect to silicon.

Reference numeral 201 denotes a switching TFT and 202 denotes a current control TFT. They are both n-channel TFTs. The n-channel TFT exhibits a field-effect mobility larger than a field-effect mobility of the p-channel TFT, and, hence, operates fast permitting a large current to flow. When the same amount of current flows, the n-channel TFT can be formed in a small size. It is therefore desired to use the n-channel TFTs as the current control TFTs enabling the effective light-emitting area of the picture display unit to be widened.

In the present invention, however, the switching TFT and the current control TFT need not be limited to the n-channel TFTs, but both of them or either one of them may be p-channel TFTs.

The switching TFT 201 includes a source region 13, a drain region 14, LDD regions 15a to 15d, an active layer including an isolation region 16 and channel-forming regions 17a, 17b, a gate-insulating film 18, gate electrodes 19a, 19b, a first interlayer insulating film 20, a source wiring 21, and a drain wiring 22. The gate insulating film 18 or the first interlayer insulating film 20 may be common to all TFTs on the substrate, or may be different depending on the circuits or the elements.

In the switching TFT 201 shown in FIG. 2, the gate electrodes 19a and 19b are electrically connected together forming a so-called double gate structure. Not being limited to the double gate structure only, there may be employed a so-called multi-gate structure such as triple gate structure, etc. (structure including an active layer having two or more channel-forming regions connected in series).

The multi-gate structure is very effective in decreasing the off-current. If the off-current of the switching TFT could be decreased to a sufficient degree, the capacity of the capacitor 112 shown in FIG. 1(B) can be decreased correspondingly. That is, the area occupied by the capacitor 112 can be decreased. Therefore, employment of the multi-gate structure is effective in expanding the effective light-emitting area of the EL element 109.

In the switching TFT 201, further, the LDD regions 15a to 15d are so provided as will not be overlapped on the gate electrodes 19a and 19b via the gate insulating film 18. This structure is very effective in decreasing the off-current. Further, the lengths (widths) of the LDD regions 15a to 15d may be from 0.5 to 3.5 μm and, typically, from 2.0 to 2.5 μm.

It is further desired to form an offset region (region formed of a semiconductor layer of the same composition as the channel-forming region but to where no gate voltage is applied) between the channel-forming region and the LDD region from the standpoint of decreasing the off-current. In the case of the multi-gate structure having two or more gate electrodes, the isolation region 16 (region to where are added the same impurity elements as those of the source region or the drain region at the same concentration) formed between the channel-forming regions, is effective in decreasing the off-current.

Next, the current control TFT 202 includes a source region 26, a drain region 27, an active layer including an LDD region 28 and a channel-forming region 29, a gate insulating film 18, a gate electrode 30, a first interlayer insulating film 20, a source wiring 31 and a drain wiring 32. In the case of FIG. 2, however, a resistor 33 and a connection region 34 are provided between the drain region 27 and the drain wiring 32.

The resistor 33 corresponds to the resistor 109 of FIG. 1(B), and the connection region 34 is a high-impurity-concentration region (impurity region of the same composition as the drain region 27) for electrically connecting the resistor 33 to the drain wiring 32. Here, the active layer of the current control TFT 202 is extended to electrically connect this TFT to the resistor 33. However, the electric connection is in no way limited to this structure only.

A thin film denoted by 55 is the one (hereinafter referred to as masking film) used as a doping mask at the time of forming the resistor 33 and is, here, formed simultaneously with the gate electrode 30. In the case of FIG. 2, the masking film 55 is an electrically conducting film made of the same material as the gate electrode 30, and may be electrically isolated.

In the structure of FIG. 2, the resistor 33 is formed by an impurity region of the same composition as the LDD region 28. The resistance is determined by the length of the resistor and the sectional area thereof. It may be formed by an intrinsic semiconductor layer without any impurity accompanied, however, by a difficulty of controlling the resistance. It is therefore desired to control the resistance by adding impurities.

When the resistor 33 is formed by the semiconductor layer as described above, the resistance may change if light emitted from the EL element falls on the resistor. As shown in FIG. 2, therefore, it is meaningful to form a masking film having light-shielding property to use it as a light-shielding film, from the standpoint of preventing a change in the resistance.

As shown in FIG. 1(B), further, the drain of the switching TFT is connected to the gate of the current control TFT. Concretely, the gate electrode 30 of the current control TFT 202 is electrically connected to the drain region 14 of the switching TFT 201 through a drain wiring (also called connection wiring) 22. The gate electrode 30 has a single-gate structure but may have a multi-gate structure. Further, the source wiring 31 is connected to the current feeder line 110 of FIG. 1(B).

The current control TFT 202 is an element for controlling the amount of current injected into the EL element and through which a relatively large current flows. Therefore, its channel width (W) is desirably designed to be wider than the channel width of the switching TFT. It is further desired to design the channel to possess an increased length (L) so that an excess current will not flow into the current control TFT 202. Desirably, the current that flows is from 0.5 to 2 μA (preferably, from 1 to 1.5 μA) per a pixel.

Figure 9:
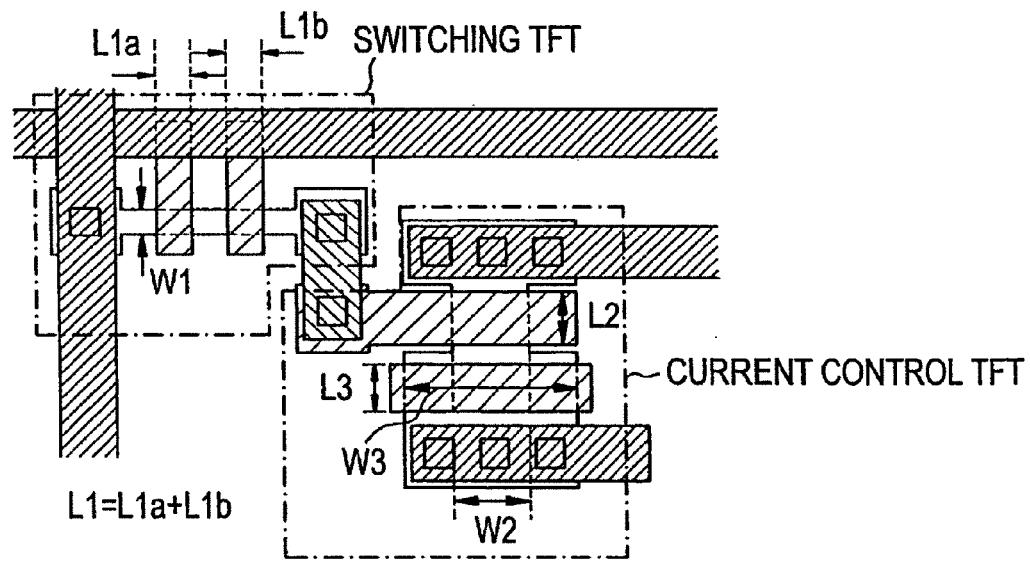
FIG. 9 is a view illustrating the pixel portion of the EL display device on an enlarged scale.
Figure 10:
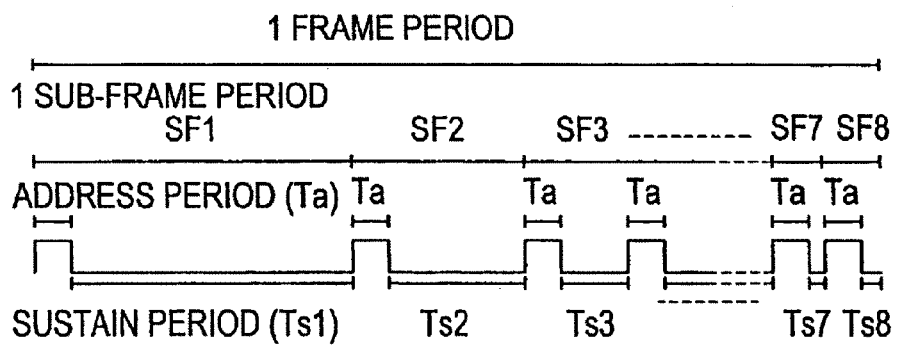
FIG. 10 is a diagram illustrating an operation mode of a time-division gradation system.

Then, referring to FIG. 9, if the channel length of the switching TFT is denoted by L1 (L1=L1a+L1b), the channel width thereof is denoted by W1, the channel length of the current control TFT by L2, and the channel width thereof by W2, it is desired that W1 is from 0.1 to 5 μm (typically from 1 to 3 μm) and W2 is from 0.5 to 30 μm (typically from 2 to 10 μm). It is further desired that L1 is from 0.2 to 18 μm (typically, from 2 to 15 μm) and L2 is from 0.1 to 50 μm (typically, from 1 to 20 (m). The invention, however, is in no way limited to the above values only. In FIG. 9, L3 denotes the length of the resistor, and W3 denotes the width of the resistor.

Further, the EL display device shown in FIG. 2 has a feature in that the LDD region 28 is provided between the drain region 27 and the channel-forming region 29 in the current control TFT 202, and, besides, the LDD region 28 includes a region overlapped on the gate 30 via the gate-insulating film 18 and a region that is not overlapped thereon.

The current control TFT 202 permits a relatively large current to flow causing the EL element 203 to emit light, and is better provided with a countermeasure against being deteriorated by the injection of hot carriers. To display a black color, the current control TFT 202 is turned off. Here, if there flows a large off-current, pure black color cannot be displayed deteriorating the contrast. It is therefore necessary to suppress the off-current.

It has been known that the structure in which the LDD region is overlapped on the gate electrode is very effective in coping with the deterioration caused by the injection of hot carriers. However, the off-current increases if the whole LDD region is overlapped. Therefore, the applicant simultaneously solves the problems of hot carriers and off-current by a novel structure in which an LDD region without overlapping on the gate electrode is provided in series in addition to the above-mentioned structure.

In this case, the LDD region overlapped on the gate electrode may have a length of from 0.1 to 3 (m (preferably, from 0.3 to 1.5 (m). Parasitic capacity increases when the LDD region is too long, and the effect for preventing hot carriers is weakened when the LDD region is too short. The LDD region that does not overlap the gate electrode may have a length of from 1.0 to 3.5 (m (preferably, from 1.5 to 2.0 (m). The current does not flow to a sufficient degree when the LDD region is too long, and the effect for decreasing the off-current is weakened when the LDD region is too short.

In the above-mentioned constitution, further, parasitic capacity is formed in the region where the gate electrode and the LDD region are overlapped one upon the other. It is therefore desired not to form the LDD region between the source region 26 and the channel-forming region 29. In the current control TFT, the carriers (electrons in this case) flow in the same direction at all times, and the LDD region provided on the side of the drain region only is enough.

From the standpoint of flowing the current in an increased amount, further, it is recommended to increase the thickness of the active layer (and, particularly, of the channel-forming region) of the current control TFT 202 (preferably, from 50 to 100 nm and, more preferably, from 60 to 80 nm). In the case of the switching TFT 201, on the other hand, it is recommended to decrease the thickness of the active layer (particularly, channel-forming region) (preferably, from 20 to 50 nm and, more preferably, from 25 to 40 nm) from the standpoint of decreasing the off-current.

In the foregoing was described the structure of the TFT provided in the pixel. At the same time, in this case, a drive circuit is formed. FIG. 2 is a diagram illustrating a CMOS circuit which is a basic unit for forming the drive circuits.

In FIG. 2, the TFT of a structure which injects hot carriers in a decreased amount without decreasing the operation speed as much as possible, is used as an n-channel TFT 204 of the CMOS circuit. The drive circuits referred to here stand for the data signal drive circuit 102 and the gate signal drive circuit 103 shown in FIG. 1. It is, of course, allowable to form other logic circuits (level shifter, A/D converter, signal-dividing circuit, etc.).

The active layer of the n-channel TFT 204 includes a source region 35, a drain region 36, an LDD region 37 and a channel-forming region 38, the LDD region 37 being overlapped on the gate electrode 39 via the gate-insulating film 18.

The LDD region is formed on the side of the drain region only in order not to decrease the speed of operation. In this n-channel TFT 204, much attention needs not be given to the off-current but rather importance is given to the operation speed. It is therefore desired that the LDD region 37 is completely overlapped on the gate electrode to decrease the resistance component as much as possible. In other words, the so-called offset is better eliminated.

The p-channel TFT 205 in the CMOS circuit is not almost deteriorated by the injection of hot carriers, and the LDD region needs not be particularly provided. Accordingly, the active layer includes a source region 40, a drain region 41 and a channel-forming region 42, and a gate-insulating film 18 and a gate electrode 43 are formed thereon. It is, of course, allowable to provide the LDD region like in the n-channel TFT 204 to cope with the hot carriers.

When a p-channel TFT is to be used as the current control TFT 202, there may be used the p-channel TFT having the same structure as the p-channel TFT 205.

Further, the n-channel TFT 204 and the p-channel TFT 205 are covered with the first interlayer insulating film 20, and are forming source wirings 44 and 45. They are electrically connected together through a drain wiring 46.

Next, reference numeral 47 denotes a first passivation film having a thickness of from 10 nm to 1 (m (preferably, from 200 to 500 nm). The material will be an insulating film containing silicon (particularly, a silicon oxynitride film or a silicon nitride film). The passivation film 47 works to protect the formed TFT from alkali metals or water. The EL layer that is finally formed on the TFT contains alkali metals such as sodium, etc. That is, the first passivation film 47 works as a protection layer that prevents alkali metals (mobile ions) from infiltrating into the TFT side.

Further, reference numeral 48 denotes a second interlayer insulating film which works as a flattening film for flattening a step formed by the TFT. As the second interlayer insulating film 48, there can be preferably used an organic resin film such as of polyimide, polyamide, acrylic or BCB (benzocyclobutene). These organic resin films form favorable flat surfaces exhibiting a small specific inductivity. Since the EL layer is very susceptible to ruggedness, it is desired that a step due to the TFT is almost all absorbed by the second interlayer insulating film. It is further desired to thickly form a material having a low specific inductivity from the standpoint of lowering the parasitic capacity formed between the gate wiring or the data wiring and the cathode of the EL element. Preferably, therefore, the film thickness is from 0.5 to 5 (m (preferably, from 1.5 to 2.5 (m).

Reference numeral 49 denotes a pixel electrode (anode of EL element) formed of a transparent electrically conducting film so as to be connected to the drain wiring 32 of the current control TFT 202 in a contact hole (opening) that is formed in the second interlayer insulating film 48 and in the first passivation film 47. With the pixel electrode 49 not being directly connected to the drain region 27 as shown in FIG. 2, the alkali metals in the EL layer are prevented from infiltrating into the active layer through the pixel electrode.

On the pixel electrode 49 is formed a third interlayer insulating film 50 which is a silicon oxide film, a silicon oxynitride film or an organic resin film maintaining a thickness of from 0.3 to 1 (m. An opening is formed by etching in the third interlayer insulating film 50 on the pixel electrode 49, the edges of the opening being tapered by etching. The tapering angle is from 10 to 60((preferably, from 30 to 50( ).

An EL layer 51 is provided on the third interlayer insulating film 50. The EL layer 51 has either a single-layer structure or a laminated-layer structure. However, a high light-emitting efficiency is obtained when it has the laminated-layer structure. In general, a positive hole injection layer, a positive hole transport layer, a light-emitting layer and an electron transport layer are formed in order mentioned on the pixel electrode. However, they may be formed in such a structure as positive hole transport layer/light-emitting layer/electron transport layer or positive hole injection layer/positive hole transport layer/light-emitting layer/electron transport layer/electron injection layer. In this embodiment, any known structure may be used, or the EL layer may be doped with a fluorescent coloring matter.

As the organic EL material, there can be used those disclosed in, for example, the following U.S. patents and Japanese Laid-Open Patents, i.e., U.S. Pat. Nos. 4,356,429, 4,539,507, 4,720,432, 4,769,292, 4,885,211, 4,950,950, 5,059,861, 5,047,687, 5,073,446, 5,059,862, 5,061,617, 5,151,629, 5,294,869, 5,294,870, and Japanese Patent Laid-Open Nos. 189525/1998, 241048/1996, and 78159/1996.

The color display systems employed for the EL display devices can roughly be divided into four systems, i.e., a system which forms EL elements of three types corresponding to R (red), G (green) and B (blue), a system based on the combination of an EL element that emits white light and a color filter (colored layer), a system based on the combination of an EL element that emits blue or bluish green light and a fluorescent material (fluorescent color-conversion layer: CCM), and a system which uses a transparent electrode as the cathode (opposing electrode) and in which the EL elements corresponding to RGB are overlapped thereon.

The structure shown in FIG. 2 is that of the case of when there is used a system that forms three kinds of EL elements corresponding to RGB. Though FIG. 2 illustrates only one pixel, the pixels of the same structure are formed being corresponded to red, green and blue, thereby to produce a color display.

The invention can be put into practice irrespective of the light-emitting system, and all of the above-mentioned four systems can be employed in the invention. However, the fluorescent material exhibits a slow response speed compared to the EL leaving a problem of residual light. Therefore, it is desired not to use the fluorescent material. It is further desired not to use a color filter that is a factor for dropping the luminance of emitted light.

The cathode 52 of the EL element is provided on the EL layer 51. As the cathode 52, there can be used a material containing magnesium (Mg), lithium (Li) or calcium (Ca) having a small work function. Desirably, there can be used an electrode of MgAg (material in which Mg and Ag are mixed at a ratio of Mg:Ag=10:1). There can be further used an MgAgAl electrode, an LiAl electrode or an LiFAl electrode.

It is desired that the cathode 52 is continuously formed without being exposed to the open air after the EL layer 51 has been formed. This is because the interfacial state between the cathode 52 and the EL layer 51 greatly affects the light-emitting efficiency of the EL element. In this specification, the light-emitting element formed of the pixel electrode (anode), EL layer and cathode, is called EL element.

A laminate of the EL layer 51 and the cathode 52 must be separately formed for each of the pixels. However, the EL layer 51 is very weak against water, and cannot be formed relying upon the ordinary photolithography technology. It is therefore desired that the EL layer 51 is selectively formed by a vacuum deposition method, a sputtering method or a gaseous phase method such as plasma CVD, by using a physical masking material such as metal mask or the like.

The EL layer can be selectively formed by an ink-jet method, a screen-printing method or a spin-coating method. At present, however, none of these methods is capable of continuously forming the cathode. It can, therefore, be said that the above-mentioned method is preferred.

Reference numeral 53 denotes a protection electrode which protects the cathode 52 from the external water component, and connects the cathodes 52 of the pixels. As the protection electrode 53, it is desired to use a material having a low resistance containing aluminum (Al), copper (Cu) or silver (Ag). The protection electrode 53 also exhibits a heat-radiating effect for reducing heat generated in the EL layer. It is effective if up to the protection electrode 53 is continuously formed without being exposed to the open air after the formation of the EL layer 51 and the cathode 52.

Reference numeral 54 denotes a second passivation film having a thickness of from 10 nm to 1 (m (preferably, from 200 to 500 nm). The second passivation film 54 is provided chiefly for protecting the EL layer 51 from the water component but still effectively exhibits its effect of radiating heat. As described above, however, the EL layer is weak against heat and is, hence, formed at a temperature as low as possible (preferably, over a temperature range of from room temperature up to 120 (C). Therefore, a desired film-forming method will be a plasma CVD method, a sputtering method, a vacuum evaporation method, an ion-plating method or a solution-coating method (spin-coating method).

EXAMPLE 1

An Example of the invention will now be described with reference to FIGS. 5 to 8. Described here is a method of simultaneously fabricating a pixel unit and TFTs in the drive circuit units provided in the peripheries thereof. Here, to simplify the description, a CMOS circuit which is a basic unit is diagramed concerning the drive circuits.

Referring, first, to FIG. 5(A), a substrate 501 is prepared having an underlying film (not shown) formed on the surface thereof. In this Example, a silicon oxynitride film having a thickness of 100 nm and a silicon oxynitride film having a thickness of 200 nm are laminated as an underlying film on a crystallized glass. Here, it is desired that the film of the side contacting to the crystallized glass substrate has a nitrogen concentration of from 10 to 25% by weight. It is, of course, allowable to directly form elements on the quartz substrate without forming the underlying film.

Next, an amorphous silicon film 502 is formed on the substrate 501 maintaining a thickness of 45 nm by a known film-forming method. Here, the film is in no way limited to the amorphous silicon film but may be a semiconductor film (inclusive of a fine crystalline semiconductor film) having an amorphous structure. It is, further, allowable to form a compound semiconductor film having an amorphous structure such as amorphous silicon germanium film.

Concerning this step through up to a step of FIG. 5(C), the content of Japanese Patent Laid-Open No. 247735/1998 filed by the present applicant can be just quoted. This publication discloses technology related to a method of crystallizing the semiconductor film using an element such as nickel or the like as a catalyst.

First, a protection film 504 having openings 503a, 503b is formed. In this Example, a silicon oxide film having a thickness of 150 nm is used. A layer (Ni-containing layer) containing nickel (Ni) is formed on the protection film 504 by a spin-coating method. As for the formation of the Ni-containing layer, reference should be made to the above publication.

Figure 19A:
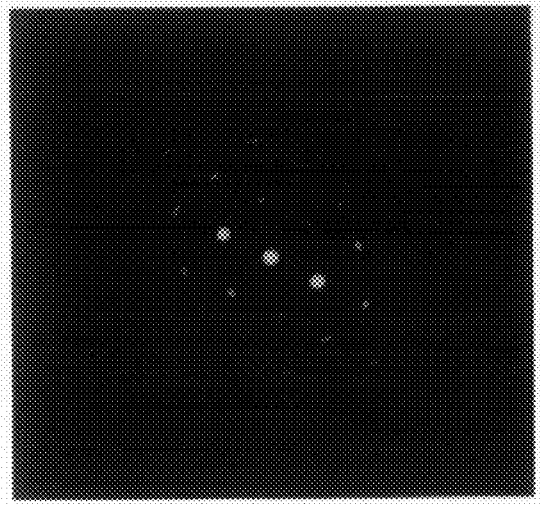
FIGS. 19(A) and 19(B) are photographs showing electron-ray diffraction images of polysilicon films.

Referring next to FIG. 5(B), heat treatment is conducted in an inert atmosphere at 570(C for 14 hours to crystallize the amorphous silicon film 502. In this case, crystallization proceeds nearly in parallel with the substrate starting from the regions (hereinafter referred to as Ni-added regions) 506a, 506b to where nickel is contacted, thereby to form a polysilicon film 507 of a crystalline structure in which rod-like crystals are collectively arranged. Here, it has been known that diffraction spots corresponding to the orientation {110} are observed on an electron-ray diffraction photograph as shown in FIG. 19(A).

Next, as shown in FIG. 5(C), an element (desirably, phosphorus) pertaining to the Group 15 is added to the Ni-added regions 506a and 506b with the protection film 504 as a mask. There are thus formed regions (hereinafter referred to as phosphorus-added regions) 508a and 508b to which phosphorus is added at a high concentration.

Referring next to FIG. 5(C), the heat treatment is conducted in an inert atmosphere at 600(C for 12 hours. Due to this heat treatment, nickel present in the polysilicon film 507 migrates and is finally almost all trapped by the phosphorus-added regions 508a and 508b as indicated by arrows. This is considered to be a phenomenon due to the gettering effect of a metal element (Ni in this embodiment) caused by phosphorus.

Due to this step, the concentration of Ni remaining in the polysilicon film 509 decreases down to at least $2\times10^{17}$ atoms/cm3 as measured by the SIMS (secondary ion mass spectrometry). Nickel is a life-time killer for the semiconductor. Being decreased down to this level, however, it no longer adversely affects the TFT characteristics. Besides, this concentration is almost the limit of measurement by the present SIMS analysis. In practice, therefore, it is considered that the concentration is much lower ($2\times10^{17}$ atoms/cm3 or lower).

Thus, there is obtained the polysilicon film 509 which is crystallized by the use of the catalyst and in which the concentration of the catalyst is decreased down to a level that does not hinder the operation of the TFT. Thereafter, the active layers 510 to 513 using the polysilicon film 509 only are formed by patterning. The active layer 513 partly includes a semiconductor layer that works as a resistor afterwards. Here, it is recommended to form a marker for aligning the masking in the subsequent patterning by using the above polysilicon film (FIG. 5(D)).

Referring next to FIG. 5(E), a silicon oxynitride film of a thickness of 50 nm is formed by the plasma CVD method, followed by the heat treatment in an oxidizing atmosphere at 950(C for one hour to execute the step of thermal oxidation. The oxidizing atmosphere may be an oxygen atmosphere or an oxygen atmosphere to which a halogen element is added.

In this step of thermal oxidation, the oxidation proceeds in the interface between the active layer and the silicon oxynitride film, whereby the polysilicon film having a thickness of about 15 nm is oxidized thereby to form a silicon oxide film maintaining a thickness of about 30 nm. That is, there is formed a gate insulating film 514 of a thickness of 80 nm including the silicon oxide film having the thickness of 30 nm and the silicon oxynitride film having the thickness of 50 nm laminated one upon the other. Further, the active layers 510 to 513 have thicknesses of 30 nm as a result of passing through the step of thermal oxidation.

Figure 6A:
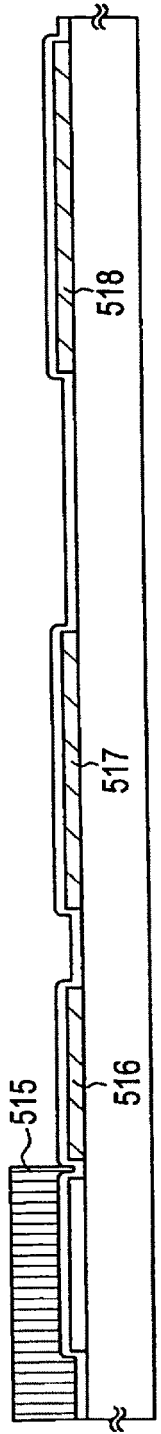
FIGS. 6(A) to 6(D) are views illustrating the steps for fabricating the EL display device.

Referring next to FIG. 6(A), a resist mask 515 is formed, and an impurity element (hereinafter referred to as p-type impurity element) is added through the gate-insulating film 514 to impart p-type. As the p-type impurity element, there can be representatively used an element pertaining to the Group 13 and, typically, boron or gallium. This step (called channel-doping step) is for controlling the threshold voltage of the TFT.

In this Example, boron is added by the plasma-excited ion-doping method without mass-separating diborane (B2H6). It is of course allowable to employ the ion implantation method which executes the mass separation. Through this step, impurity regions 516 to 518 are formed containing boron at a concentration of $1\times10^{15}$ to $1\times10^{18}$ atoms/cm3 (typically, $5\times10^{16}$ to $5\times10^{17}$ atoms/cm3).

Figure 6B:
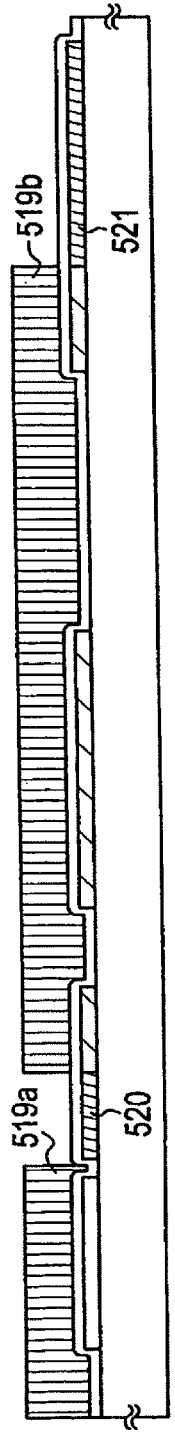

Referring next to FIG. 6(B), resist masks 519a and 519b are formed, and an impurity element (hereinafter referred to as n-type impurity element) is added through the gate-insulating film 514 to impart n-type. As the n-type impurity element, there can be representatively used an element pertaining to the Group 15 and, typically, phosphorus or arsenic. In this Example, phosphorus is added at a concentration of $1\times10^{18}$ atoms/cm$^3$ by the plasma-excited plasma-doping method without mass-separating phosphine (PH$_3$). It is of course allowable to use the ion implantation method that executes the mass separation.

The dosage is so adjusted that the n-type impurity regions 520 and 521 formed through the above step contain n-type impurity element at a concentration of from $2\times10^{16}$ to $5\times10^{19}$ atoms/cm$^3$ (typically, from $5\times10^{17}$ to $5\times10^{18}$ atoms/cm$^3$).

Figure 6C:
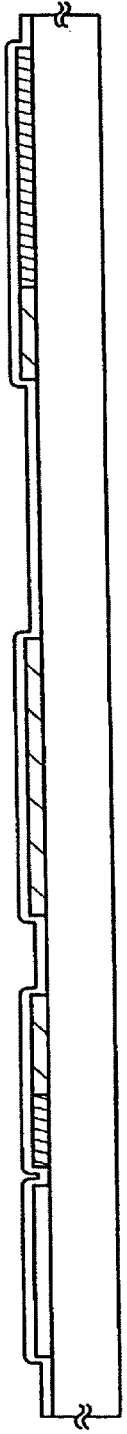
Figure 6D:
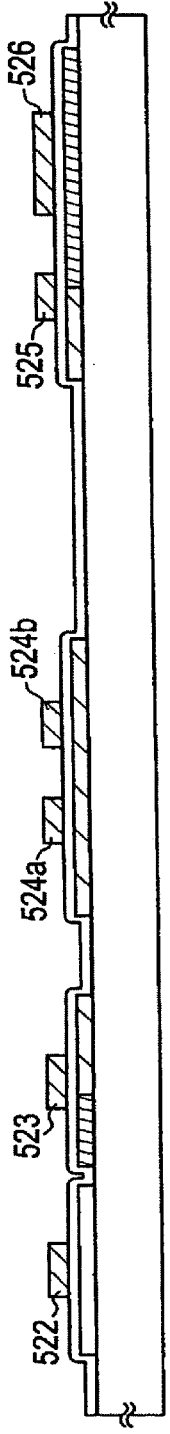

Referring next to FIG. 6(C), the n-type impurity element and the p-type impurity element that are added are activated. Though there is no need of limiting the means of activation, it is desired to execute the furnace annealing using an electrically heated furnace since the device is provided with the gate-insulating film 514. In the step of FIG. 6(A), further, there is a probability that the interface between the active layer and the gate-insulating film has been damaged in a portion that becomes the channel-forming region. It is therefore desired to execute the heat treatment at a temperature as high as possible.

This Example uses a crystallized glass having a high heat resistance. Therefore, the step of activation is executed relying on the furnace annealing at 800° C. for one hour. The thermal oxidation may be executed in an oxidizing atmosphere, or the heat treatment may be executed in an inert atmosphere. Here, however, the step of activation is not an essential requirement.

This step clarifies the boundary portion (junction portion) to the ends of the n-type impurity regions 520, 521, i.e., to the region (p-type impurity region formed by the step of FIG. 6(A)) to where n-type impurity element has not been added around the n-type impurity regions 520, 521. This means that the LDD region and the channel-forming region are capable of forming a very favorable junction portion at a moment when the TFT is completed subsequently.

Next, an electrically conducting film is formed maintaining a thickness of 200 to 400 nm and, then, a masking film 526 is formed to form gate electrodes 522 to 525 and resistors by patterning. The channel lengths of the TFTs are determined by the widths of the gate electrodes 522 to 525. Further, the resistance of the resistors is determined by the width of the masking film 526.

The gate electrodes may be formed of a single electrically conducting film. As required, however, the gate electrodes may be formed of a laminated film of two layers or three layers. As the material of the gate electrodes, there can be used a known electrically conducting film. Concretely, there can be used a film of an element selected from tantalum (Ta), titanium (Ti), molybdenum (Mo), tungsten (W), chromium (Cr) and silicon (Si), or a film of a nitride of the above element (typically, a tantalum nitride film, a tungsten nitride film or a titanium nitride film), an alloy film of a combination of the above elements (typically, a Mo—W alloy or a Mo—Ta alloy), or a silicide film of the above element (typically, a tungsten silicide film or a titanium silicide film). The film may be used in the form of a single layer or laminated layers, as a matter of course.

This embodiment uses a laminated-layer film of the tungsten nitride (WN) film having a thickness of 50 nm and the tungsten (W) film having a thickness of 350 nm. This may be formed by the sputtering method. Addition of inert gases such as xenon (Xe), neon (Ne), etc. as sputtering gases, prevents the film from being peeled by stress.

Here, the gate electrodes 523 and 525 are so formed as to be overlapped on portions of the n-type impurity regions 520 and 521 via the gate-insulating film 514. The overlapped portions subsequently become the LDD regions overlapped on the gate electrodes. The gate electrodes 524a and 524b appear to be separate from each other, but are really electrically connected together.

Referring next to FIG. 7(A), an n-type impurity element (phosphorus in this Example) is added using the gate electrodes 522 to 525 and the masking film 526 as masks. To the thus formed impurity regions 527 to 533 are added phosphorus at a concentration of from ½ to ⅒ (typically, from ⅓ to ¼) that of the n-type impurity regions 520 and 521. Concretely, it is desired that the phosphorus concentration is from $1\times10^{16}$ to $5\times10^{18}$ atoms/cm$^3$ (typically, $3\times10^{17}$ to $3\times10^{18}$ atoms/cm$^3$).

Referring next to FIG. 7(B), resist masks 534a to 534d are formed so as to cover the gate electrodes, and an n-type impurity element (phosphorus in this Example) is added to form impurity regions 535 to 542 containing phosphorus at a high concentration. In this case, too, phosphorus is added by the ion-doping method using phosphine (PH$_3$), and the phosphorus concentration in the regions is adjusted to be from $1\times10^{20}$ to $1\times10^{21}$ atoms/cm$^3$ (typically, from $2\times10^{20}$ to $5\times10^{20}$ atoms/cm$^3$).

The source region or the drain region of the n-channel TFT is formed through the above step. Here, however, the n-type impurity regions 530 to 532 formed in the step of FIG. 7(A) are partly remaining in the switching TFT. The thus remained regions correspond to the LDD regions 15a to 15d of the switching TFT in FIG. 2.

Next, as shown in FIG. 7(C), the photoresist masks 534a to 534c are removed, and a new resist mask 543 is formed. Then, a p-type impurity element (boron in this Example) is added to form impurity regions 544 and 545 containing boron at a high concentration. Here, boron is added by the ion-doping method using diborane (B$_2$H$_6$) at a concentration of from $3\times10^{20}$ to $3\times10^{21}$ atoms/cm$^3$ (typically, from $5\times10^{20}$ to $1\times10^{21}$ atoms/cm$^3$).

In the impurity regions 544 and 545, phosphorus has been added already at a concentration of from $1\times10^{20}$ to $1\times10^{21}$ atoms/cm$^3$. Here, however, boron is added at a concentration at least three times as large or more. Therefore, the n-type impurity regions that have been formed in advance are all inverted into the p-type, and work as p-type impurity regions.

Referring next to FIG. 7(D), the photoresist mask 543 is removed and, then, a first interlayer insulating film 546 is formed. As the first interlayer insulating film 546, an insulating film containing silicon may be used in the form of a single layer or laminated layers of a combination thereof. The film may have a thickness of from 400 nm to 1.5 µm. In this embodiment, the film has a laminated-layer structure including a silicon oxide film of a thickness of 800 nm laminated on a silicon oxynitride film of a thickness of 200 nm.

Thereafter, the n-type and p-type impurity elements added at their respective concentrations are activated. Preferred activating means is the furnace annealing. In this Example, the heat treatment is effected in a nitrogen atmosphere at 550° C. for 4 hours.

Then, the heat treatment is effected in an atmosphere containing 3 to 100% of hydrogen at 300 to 450° C. for 1 to 12 hours to effect the hydrogenation. This step is to terminate the unpaired bonding hands of the semiconductor film with hydrogen that is thermally excited. As another means for hydrogenation, the plasma hydrogenation (using hydrogen excited by plasma) may be executed.

The hydrogenation treatment may be executed while the first interlayer insulating film 546 is being formed. That is, after the silicon oxynitride film is formed maintaining a thickness of 200 nm, the hydrogenation treatment may be effected and, then, the silicon oxide film may be formed maintaining a thickness of 800 nm.

Figure 8A:
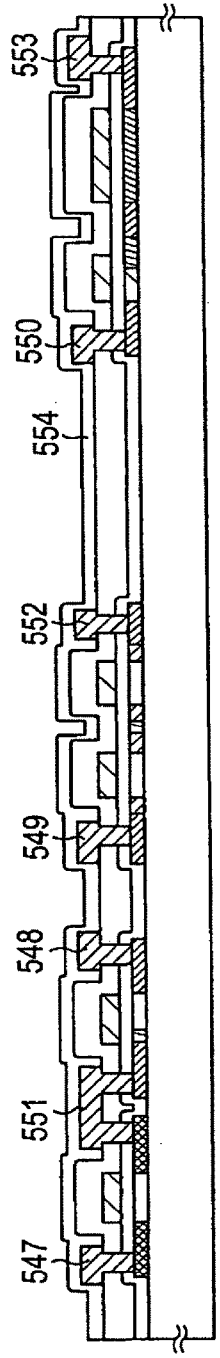
FIGS. 8(A) to 8(C) are views illustrating the steps for fabricating the EL display device.

Referring next to FIG. 8(A), contact holes are formed in the first interlayer insulating film 546 to form source wirings 547 to 550 and drain wirings 551 to 553. In this Example, the electrodes are formed of a laminated-layer film of a three-layer structure of a Ti film which is 100 nm thick, an aluminum film containing Ti which is 300 nm thick and a Ti film which is 150 nm thick, that are continuously formed by sputtering.

Next, a first passivation film 554 is formed maintaining a thickness of from 50 to 500 nm (typically, from 200 to 300 nm). In this Example, a silicon oxynitride film of a thickness of 300 nm is used as the first passivation film 554. This may be replaced by a silicon nitride film.

Here, it is effective if a plasma treatment is conducted by using a gas containing H$_2$, NH$_3$ or the like that contains hydrogen prior to forming the silicon oxynitride film. Hydrogen excited by this pre-treatment is supplied to the first interlayer insulating film 546, and the quality of the first passivation film 554 is improved by the heat treatment. At the same time, hydrogen added to the first interlayer insulating film 546 diffuses into the lower layer, so that the active layer is effectively hydrogenated.

Figure 8B:
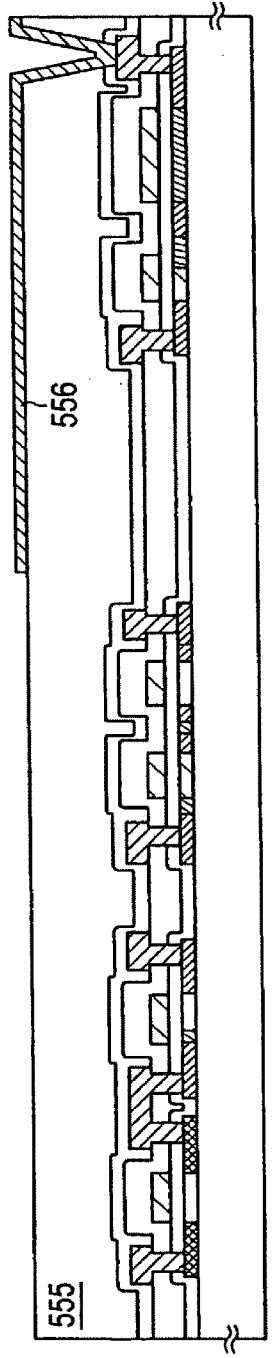

Referring next to FIG. 8(B), a second interlayer insulating film 555 of an organic resin is formed. As the organic resin, there can be used a polyimide, an acrylic or a BCB (benzocyclobutene). The second interlayer insulating film 555 must flatten a step formed by the TFT and, hence, it is desired to use an acrylic film having excellent flatness. In this Example, an acrylic film is formed maintaining a thickness of 2.5 µm.

Next, a contact hole is formed in the second interlayer insulating film 555 and in the first passivation film 554 to reach the drain wiring 553, thereby to form a pixel electrode (anode) 556. In this embodiment, an indium oxide/tin (ITO) film is formed maintaining a thickness of 110 nm which is then patterned to form a pixel electrode. There may be used a transparent electrically conducting film by mixing indium oxide with 2 to 20% of zinc oxide (ZnO). The pixel electrode serves as an anode of the EL element.

Next, an insulating film containing silicon (silicon oxide film in this Example) is formed maintaining a thickness of 500 nm, and an opening is formed therein at a position corresponding to the pixel electrode 556 to form a third interlayer insulating film 557. In forming the opening, a tapered side wall can be easily formed by the wet etching method. When the side wall of the opening is not sloping gently enough, the EL layer is deteriorated to a conspicuous degree due to the step.

Next, the EL layer 558 and the cathode (MgAg electrode) 559 are continuously formed by the vacuum evaporation method without being exposed to the open air. The EL layer 558 has a thickness of from 80 to 200 nm (typically, from 100 to 120 nm), and the cathode 559 has a thickness of from 180 to 300 nm (typically, from 200 to 250 nm).

In this step, the EL layers and the cathodes are successively formed for a pixel of red color, for a pixel of green color and for a pixel of blue color. Here, however, the EL layer has poor resistance against the solution, and must be separately formed for each of the colors without relying on the photolithography technology. By using the metal mask, therefore, the areas are concealed except the desired pixels, and the EL layer and the cathode are selectively formed on the required portions only.

That is, a mask is set to conceal all areas except the pixel for the red color and, by using this mask, the EL layer and the cathode are selectively formed for emitting light of red color. Next, a mask is set to conceal all areas except the pixel for the green color and, by using this mask, the EL layer and the cathode are selectively formed for emitting light of green color. Next, similarly, a mask is set to conceal all areas except the pixel for the blue color and, by using this mask, the EL layer and the cathode are selectively formed for emitting light of blue color. Though different masks were used above, it is also allowable to use the same mask repetitively. It is desired to conduct the treatment without breaking the vacuum condition until the EL layer and the cathode are formed on all pixels.

A known material can be used as the EL layer 558. A desired example of the known material is an organic material by taking a drive voltage into consideration. For example, the EL layer may have a 4-layer structure including a positive hole injection layer, a positive hole transport layer, a light-emitting layer and an electron injection layer. In this Example, further, the MgAg electrode was used as the cathode of the EL element. However, any other known material may be used.

As the protection electrode 560, further, there may be used an electrically conducting film of aluminum as a chief component. The protection electrode 560 may be formed by the vacuum evaporation method by using a mask different from the one used for forming the EL layer and the cathode. It is further desired that the protection electrode 560 is continuously formed without being exposed to the open air after the formation of the EL layer and the cathode.

Finally, the second passivation film 561 which is the silicon nitride film is formed maintaining a thickness of 300 nm. In practice, the protection electrode 560 plays the role of protecting the EL layer from the water. Upon forming the second passivation film 561, reliability of the EL element can be further enhanced.

Figure 8C:
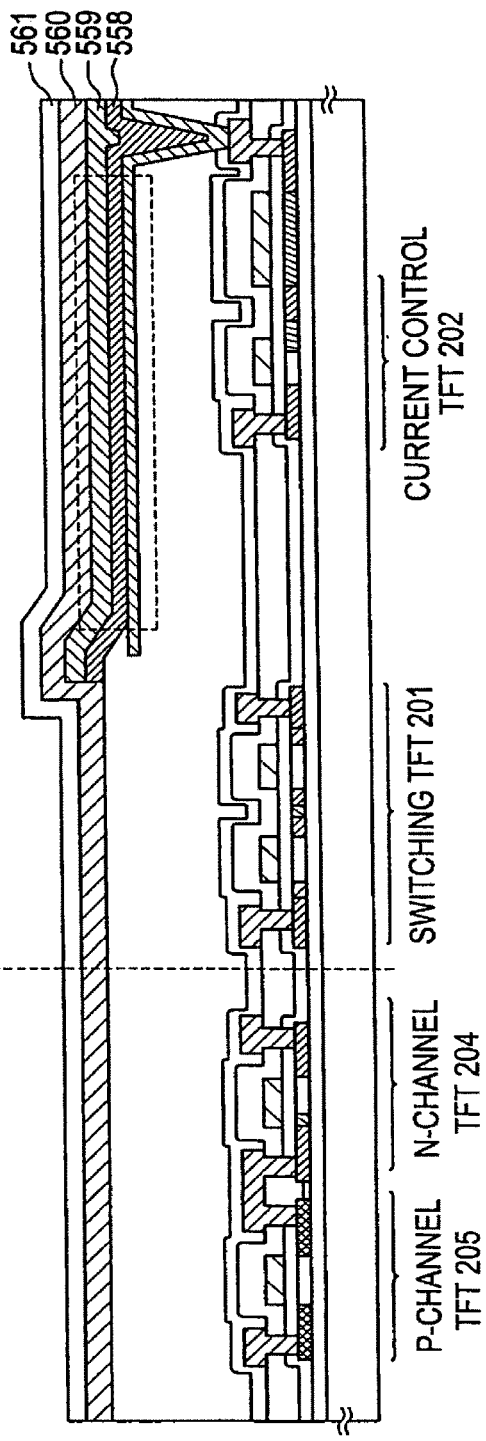

Thus, the active matrix-type EL display device of the structure shown in FIG. 8(C) is completed. In practice, after completed up to FIG. 8(C), it is desired to package (seal) the device with a highly air-tight protection film (laminated film, ultraviolet-ray curable resin film, etc.) or with a housing member such as ceramic sealing container. In this case, the interior of the housing member is filled with an inert atmosphere. Or, a hygroscopic material (e.g., barium oxide) is disposed in the interior to improve the reliability (life) of the EL layer.

After the air-tightness is heightened by the treatment such as packaging, a connector (flexible printed circuit: FPC) is attached for connecting the elements formed on the substrate or for connecting the terminals drawn from the circuit to the external signal terminals, thereby to obtain a finished product. The EL display device that is completed up to a state ready for shipment is referred to as EL module in this specification.

Figure 11:
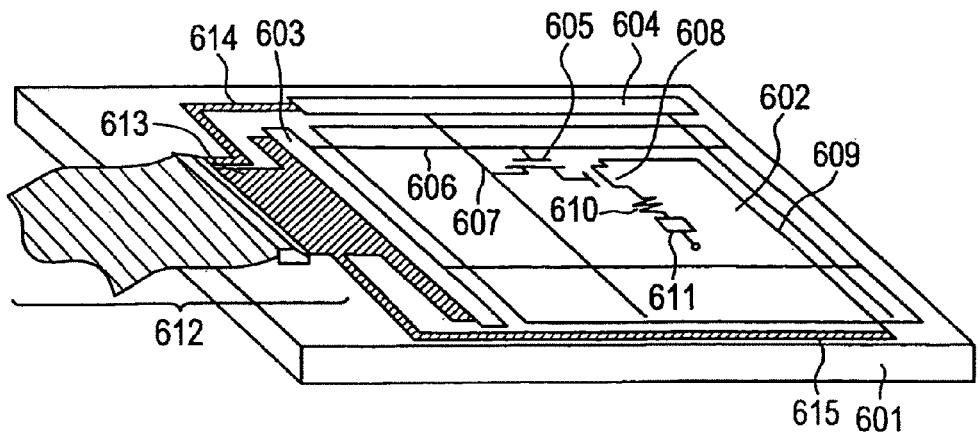
FIG. 11 is a view showing the appearance of an EL module.

The constitution of the active matrix-type EL display device of this Example will now be described with reference to a perspective view of FIG. 11. The active matrix-type EL display device of this Example is constituted by a pixel unit 602, a gate-side drive circuit 603 and a source-side drive circuit 604 formed on a glass substrate 601. A switching TFT 605 in the pixel unit is an n-channel TFT which is disposed at an intersecting point of a gate wiring 606 connected to the gate-side drive circuit 603 and a source wiring 607 connected to the source-side drive circuit 604. The drain of the switching TFT 605 is connected to the gate of a current control TFT 608.

The source of the current control TFT 608 is connected to a current feeder line 609, and the drain of the current control TFT 608 is connected to an EL element 611 via a resistor 610. A predetermined voltage is applied to the cathode of the EL element 611.

An FPC 612 which serves as external input terminals is provided with input wirings (connection wirings) 613, 614 for transmitting signals to the drive circuits, and with an input wiring 615 connected to the current feeder line 609.

Figure 12A:
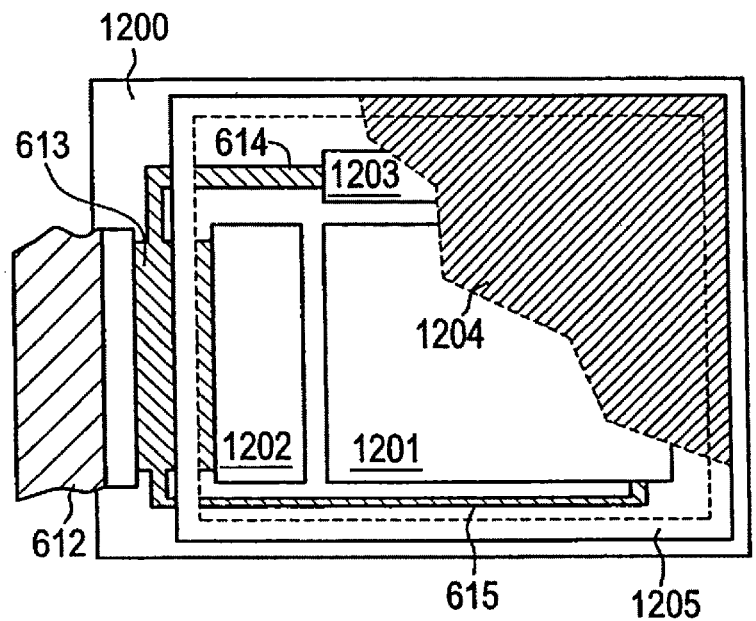
FIGS. 12(A) and 12(B) are views showing the appearance of the EL module.

The EL module of this Example inclusive of the housing member will now be described with reference to FIGS. 12(A) and 12(B). As required, reference numerals used in FIG. 11 will be quoted.

On a substrate 1200 are formed a pixel unit 1201, a data signal-side drive circuit 1202, and a gate signal-side drive circuit 1203. The wirings from the drive circuits arrive at FPC 612 through input wirings 613 to 615 and are connected to an external unit.

In this case, the housing member 1204 is provided to at least surround the pixel unit and, preferably, the drive circuits and the pixel unit. The housing member 1204 is of a shape having a recessed portion of which the inner size is larger than the outer size of the EL element, or is of the shape of a sheet, and is secured with an adhesive 1205 to the substrate 1200 so as to form a sealed space together with the substrate 1200. In this case, the EL element is completely sealed in the sealed space and is completely shut off from the external air. The housing members 1204 may be provided in a plural number.

It is desired that the material of the housing member 1204 is an insulating material such as glass polymer or the like. There can be exemplified an amorphous glass (borosilicate glass, quartz), a crystallized glass, a ceramic glass, an organic resin (acrylic resin, styrene resin, polycarbonate resin or epoxy resin) or a silicone resin. There may be further used ceramics. There can be further used a metal material such as stainless steel alloy when the adhesive 1205 is an insulating material.

Further, the material of the adhesive 1205 may be an epoxy resin or an acrylate resin. It is further allowable to use a thermosetting resin or a photo-curing resin as an adhesive. As far as possible, however, the material should not permit water to pass through.

It is further desired that a gap 1206 between the housing member and the substrate 1200 is filled with an inert gas (argon, helium, neon or nitrogen). Not being limited to gases, furthermore, an inert liquid (liquid fluorinated carbon, etc. as represented by perfluoroalkane) may be used. As for the inert liquid, there may be used materials used in Japanese Patent Laid-Open No. 78519/1996.

It is also effective if a drying agent is provided in space 1206. The drying agent may be a material disclosed in Japanese Patent Laid-Open No. 148066/1997. Typically, barium oxide may be used.

Figure 12B:
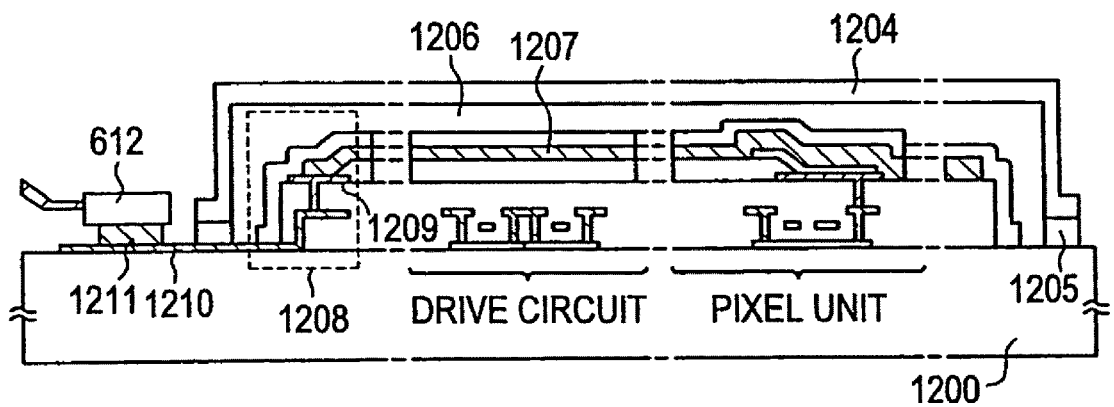

As shown in FIG. 12(B), further, the pixel unit is provided with a plurality of pixels each having an independent EL element, the pixels all having the protection electrode 1207 as a common electrode. In this Example, it is desired to continuously form the EL layer, cathode (MgAg electrode) and protection electrode without exposing them to the open air. Here, however, the structure of FIG. 12(B) can be realized if the EL layer and the cathode are formed by using the same masking material, and if the protection electrode only is formed by using another masking material.

Here, the EL layer and the cathode may be provided on the pixel unit only but needs not be provided on the drive circuits. It is, of course, allowable to provide them on the drive circuits. They, however, are better not provided on the drive circuits by taking into consideration the fact that alkali metals are contained in the EL layer.

The protection electrode 1207 is connected to the input wiring 1210 through the connection wiring 1209 made of the same material as the pixel electrode on a region denoted by 1208. The input wiring 1210 is a current feeder line for applying a predetermined voltage (ground potential in this Example or, concretely, 0 V) to the protection electrode 1207, and is connected to the FPC 611 via an electrically conducting paste material 1211.

Figure 13A:
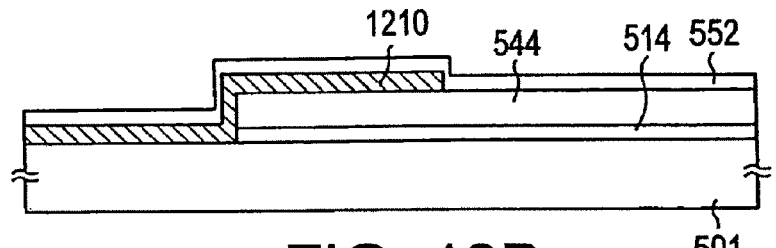
FIGS. 13(A) to 13(C) are views illustrating the steps for fabricating a contact structure.
Figure 13B:
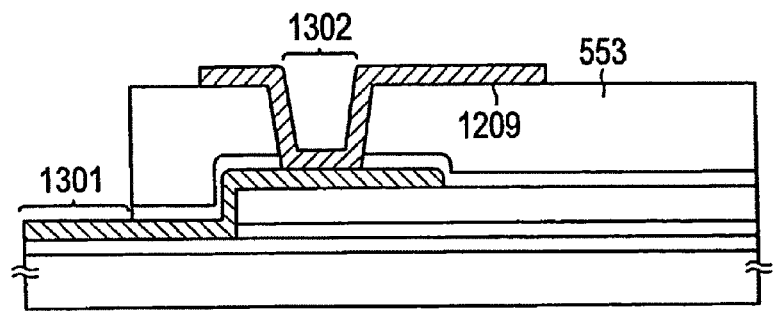
Figure 13C:
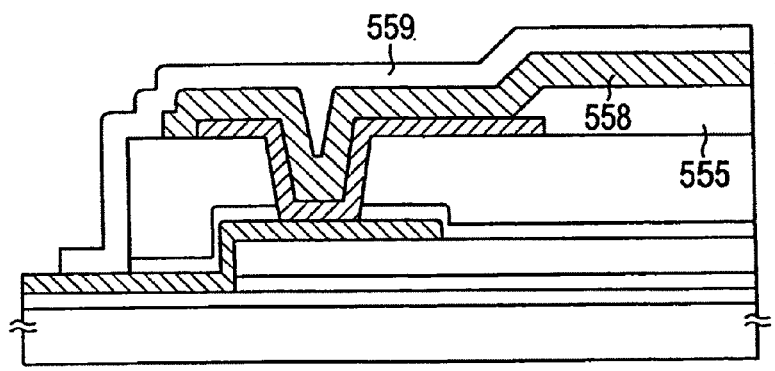

Steps of fabrication for realizing the contact structure in the region 1208 will now be described with reference to FIG. 13.

First, a state of FIG. 8(A) is obtained according to the steps of the Example. Here, the first interlayer insulating film 544 and the gate insulating film 514 are removed at an end of the substrate (region denoted by 1208 in FIG. 12(B)), and an input wiring 1210 is formed thereon simultaneously with the formation of the source wiring and drain wiring of FIG. 8(A), as a matter of course (FIG. 13(A)).

Referring next to FIG. 8(B), a region denoted by 1301 is removed and an opening 1302 is formed at the time of etching the second interlayer insulating film 553 and the first passivation film 552. A connection wiring 1209 is so formed as to cover the opening 1302. The connection wiring 1209 is formed simultaneously with the pixel electrode 554 in FIG. 8(B), as a matter of course (FIG. 13(B)).

In this state, the EL element is formed (formation of a third interlayer insulating film, EL layer and cathode) in the pixel unit. Here, the third interlayer insulating film and the EL element are not formed on the region shown in FIG. 13 by using a mask or the like. After a cathode 557 is formed, a protection electrode 558 is formed by using another mask. Thus, the protection electrode 558 and the input wiring 1210 are electrically connected together through the connection wiring 1209. Then, a second passivation film 559 is formed to obtain a state shown in FIG. 13(C).

Through the above-mentioned steps, the contact structure of the region denoted by 1208 in FIG. 12(B) is realized. The input wiring 1210 is connected to the FPC 611 through a gap (filled with the adhesive 1205 which must have a thickness large enough for flattening the step of the input wiring) between the housing member 1204 and the substrate 1200. Though the input wiring 1210 was described here, other input wirings 612 to 614, too, are connected to the FPC 611 passing under the housing member 1204 in the same manner.

EXAMPLE 2

Figure 14:
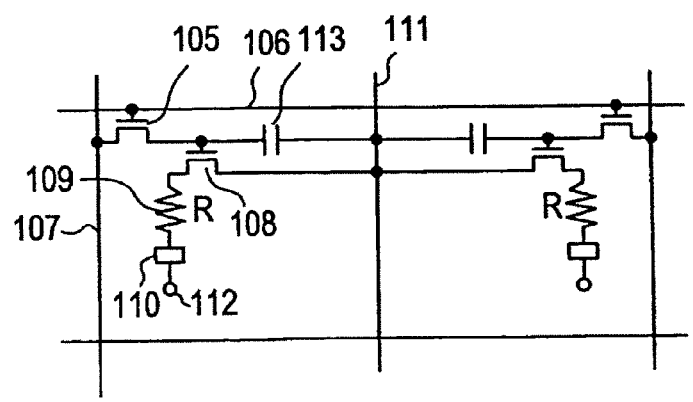
FIG. 14 is a diagram illustrating the constitution of the pixel portion of the EL display device.

This Example deals with a constitution of the pixel as shown in FIG. 14 which is different from the constitution shown in FIG. 1(B).

In this Example, the two pixels shown in FIG. 1(B) are symmetrically arranged with respect to the current feeder line 111 that applies ground potential. That is, as shown in FIG. 14, the current feeder line 111 is used in common by the two neighboring pixels to decrease the number of the wirings. There is no change in the structure of the TFTs arranged in the pixels.

This constitution makes it possible to fabricate a more fine pixel unit and to improve the quality of the picture.

By using the current feeder line 111 in common, further, the current feeder line 111 gains an increased margin in its width; i.e., the width of the current feeder line 111 can be increased without decreasing the brightness of the picture. This decreases the effect caused by a drop in the voltage of the current feeder line 111, preventing such an occurrence that the voltage supplied through the current feeder line 111 varies depending upon the position of the pixel.

The constitution of this Example can be easily realized according to the steps of fabrication of Example 1.

EXAMPLE 3

Figure 15:
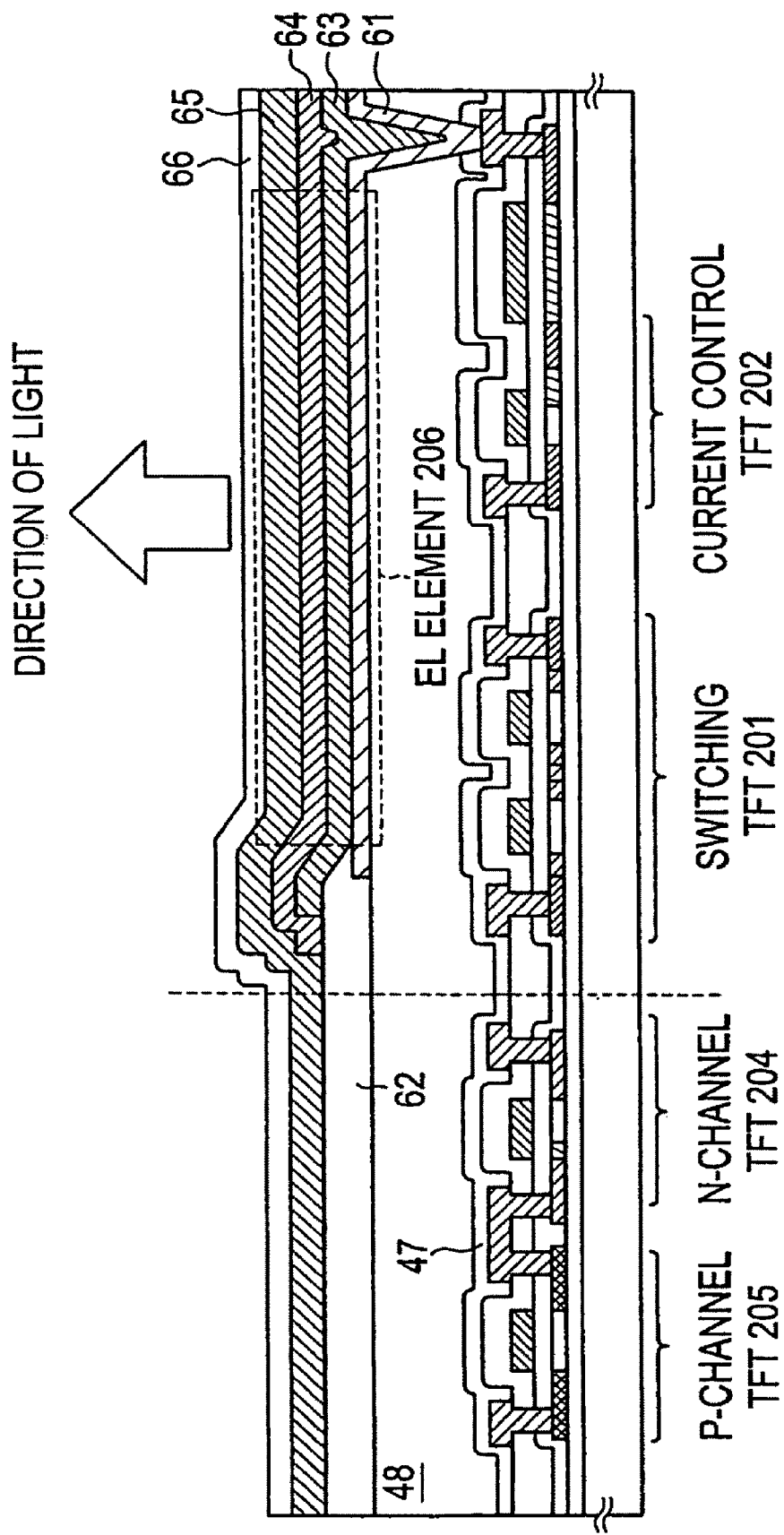
FIG. 15 is a view illustrating, in cross section, the structure of the EL display device.

This Example deals with a case of forming the pixel unit of a structure different from that of FIG. 1 with reference to FIG. 15. The steps up the step of forming the second interlayer insulating film 48 may follow those of Example 1. The switching TFT 201 covered with the second interlayer insulating film 48 and the current control TFT 202 have the same constitutions as those of FIG. 1 and are not described here.

In this Example, a pixel electrode 61 is formed after the contact holes are formed in the second interlayer insulating film 48 and in the first passivation film 47. In this Example, an aluminum alloy film (aluminum film containing 1% by weight of titanium) is formed maintaining a thickness of 200 nm as the pixel electrode 61. Any metal material may be used as the pixel electrode, but it is desired that the pixel electrode has a high reflection factor.

Then, a third interlayer insulating film 62 which is a silicon oxide film is formed thereon maintaining a thickness of 300 nm, followed by the formation of an MgAg electrode having a thickness of 230 nm as a cathode 63 and followed, from the lower side, by the formation of an electron transport layer of a thickness of 20 nm, a light-emitting layer of a thickness of 40 nm and a positive hole transport layer of a thickness of 30 nm as an EL layer 64. Here, the EL layer 64 must be formed having a pattern slightly larger than the cathode 63. This prevents the cathode 63 from being short-circuited to an anode 65 that will be formed subsequently.

Here, the cathode 63 and the EL layer 64 are continuously formed by using a vacuum evaporation machine of a multi-chamber type (also called cluster tool system) without being exposed to the open air. First, the cathode 63 is formed on all pixels using a first mask and, then, the EL layer that emits red light is formed using a second mask. Then, the EL layer that emits green light and the EL layer that emits blue light are successively formed while precisely shifting the second mask.

When the pixels corresponding to RGB are arranged like a stripe, the second mask may simply be shifted by the method described above. However, to realize the pixel structure of a so-called delta arrangement, a third mask may be used for the EL layer for emitting green light and a fourth mask may be used for the EL layer for emitting blue light.

After the formation of up to the EL layer 64, an anode 65 of a transparent electrically conducting film (thin film which is an ITO film containing 10% by weight of zinc oxide in this embodiment) is formed thereon maintaining a thickness of 110 nm. Thus, the EL element 206 is formed, and a pixel having a structure shown in FIG. 15 is completed if there is formed a second passivation film 66 using the material described in Example 1.

In the constitution of this Example, red light, green light and blue light formed by the pixels are emitted to the side opposite to the substrate on which TFTs are formed. Therefore, almost all areas in the pixel, i.e., the region in which the TFT is formed, can be used as an effective light-emitting region. As a result, the pixel possesses a greatly increased effective light-emitting area contributing to enhancing the brightness of picture and a contrast ratio (bright-dark ratio).

The constitution of this Example can be freely combined with any of the constitutions of Example 1 or 2.

EXAMPLE 4

This Example deals with the structure of the pixel in the active matrix-type EL display device fabricated according to Example 1. The description refers to FIG. 16 wherein the portions corresponding to those of FIGS. 1 and 2 are denoted by the same reference numerals as those of FIGS. 1 and 2.

Figure 16:
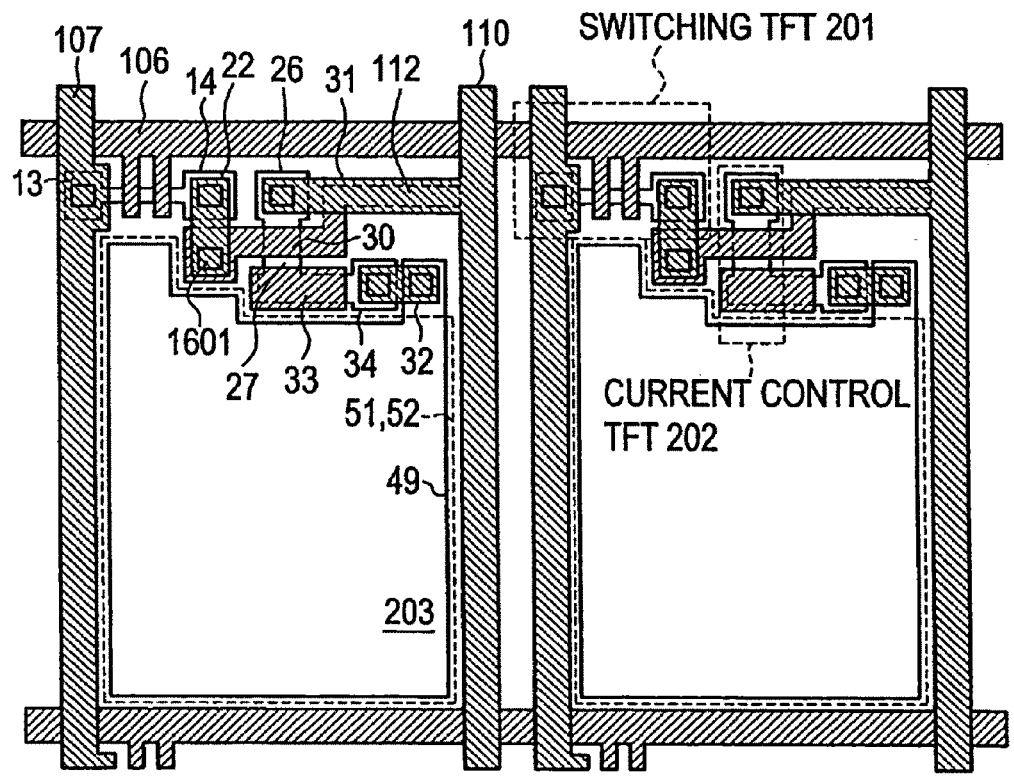
FIG. 16 is a view illustrating the structure of an upper surface of the pixel portion of the EL display device.

In FIG. 16, reference numeral 201 denotes a switching TFT which includes a source region 13, a drain region 14 and a gate wiring (also serves as a gate electrode) 106. Further, reference numeral 202 denotes a current control TFT which includes a source region 26, a drain region 27 and a gate electrode 30. Further, the drain of the current control TFT 202 is electrically connected to the pixel electrode 49 through a resistor 33 (semiconductor layer present under the masking film 55 in FIG. 16), a connection region 34 and a drain wiring 32. Dotted lines 51 and 52 indicate positions where the EL layer 51 and the cathode 52 are formed, and the EL element 203 is formed by the pixel electrode 49, EL layer 51 and cathode 52.

Here, the drain wiring 22 of the switching TFT 201 is electrically connected to the gate electrode 30 of the current control TFT 202 through a contact portion 1601. Further, the gate electrode 30 forms a holding capacity 113 at a portion where it is overlapped on the source wiring 31 of the current control TFT 202. The source wiring 31 is electrically connected to the current feeder line 111.

In this Example, the pixel structure shown in FIG. 16 does not at all limit the invention but simply represents a preferred example. Positions where the switching TFT, current control TFT and holding capacity will be formed may be suitably selected by a designer. This Example can be freely combined with any of the constitutions of Examples 1 to 3.

EXAMPLE 5

Figure 17:
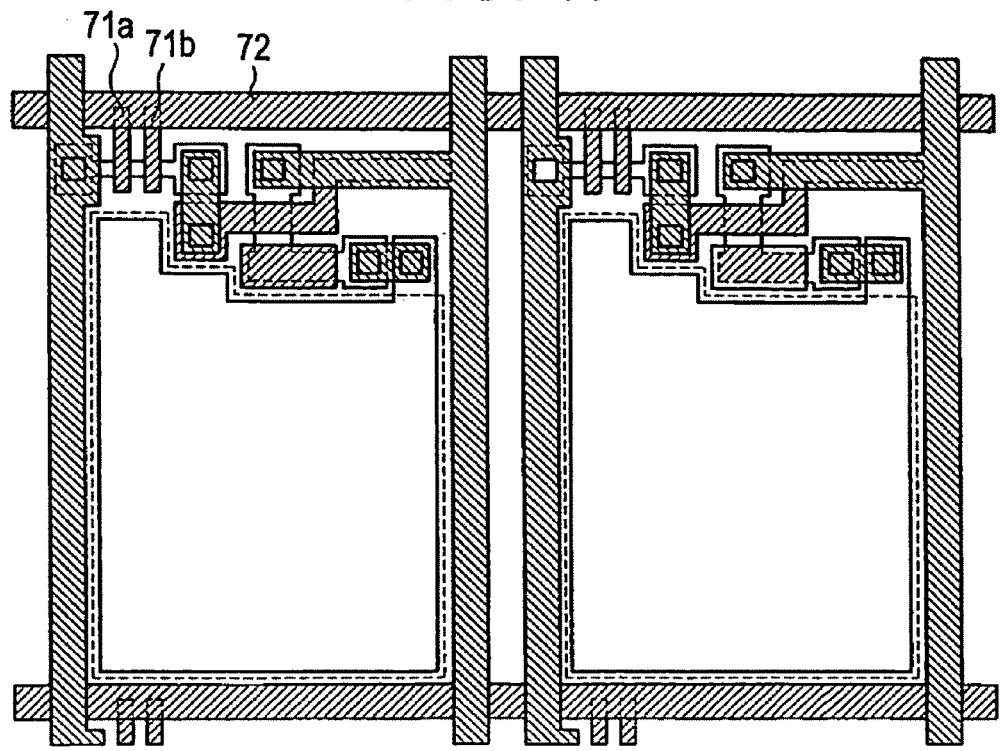
FIG. 17 is a view illustrating the structure of the upper surface of the pixel portion of the EL display device.

This Example deals with a pixel structure in the active matrix-type EL display device different from the structure of Example 4. Concretely, FIG. 16 illustrates a pixel structure and FIG. 17 illustrates a pixel structure in which the material of the gate wiring only is different from FIG. 16. The constitution of FIG. 17 is the same as that of FIG. 16 except the gate wiring constitution, and is not described in detail here.

In FIG. 17, reference numerals 71a and 71b denote gate electrodes formed by a laminated film of a tungsten nitride film and a tungsten film like the gate electrode of Example 1. They may have independent patterns as shown in FIG. 17 or may have patterns that are electrically connected together. The gate electrodes are electrically floated at a moment when they are formed. As the gate electrodes 71a, 71b, there may be used a laminated film of a tantalum nitride film and a tantalum film, or any other electrically conducting film such as an alloy film of molybdenum and tungsten. It is, however, desired that the film can be excellently worked to form fine lines of a width of not larger than 3 μm (preferably, not larger than 2 μm). It is further desired that the film does not contain element that may diffuse in the gate insulating film to infiltrate into the active layer.

As the gate wiring 72, on the other hand, there is used an electrically conducting film having a resistance smaller than that of the gate electrodes 71a, 71b and, typically, an alloy film containing aluminum as a chief component or an alloy film containing copper as a chief component. The gate wiring 72 does not require any particular fine workability. Besides, since it will not be overlapped on the active layer, there arouses no problem even if it contains aluminum or copper that may easily diffuse in the insulating film.

To realize the structure of this Example, the step of activation may be executed prior to forming the first interlayer insulating film 544 in the step of FIG. 7(D) of Example 1. In this case, heat treatment is effected in a state where the gate electrodes 71a and 71b are exposed. When the heat treatment is effected in a sufficiently inert atmosphere or in an inert atmosphere where the oxygen concentration is, preferably, not larger than 1 ppm, the gate electrodes 71a and 71b are not oxidized. That is, the resistance is not increased by oxidation, and the gate electrodes are not covered with an insulating film (oxide film) which is difficult to remove.

After the step of activation has finished, an electrically conducting film of aluminum or copper as a chief component is formed, and a gate wiring 72 is formed by patterning. At this moment, a favorable ohmic contact is maintained at portions where the gate electrodes 71a, 71b come into contact with the gate wiring 72, enabling a predetermined gate voltage to be applied to the gate electrodes 71a, 71b.

The constitution of this embodiment is effective particularly when the picture display region has an increased region. The reason will be described below.

In the EL display device of the invention, a frame is driven being divided into a plurality of sub-frames, and the drive circuits for driving the pixel unit must bear a large burden. To decrease the burden, the loads (wiring resistance, parasitic capacity, writing capacity of TFT, etc.) possessed by the pixel unit are better decreased as much as possible.

The writing capacity of TFT is not much of a problem since TFT having a very high operation performance can be realized by using a polysilicon film. The capacity that is parasitic to the data wiring or the gate wiring, is mostly formed relative to the cathode (or protection electrode) of the EL element formed on the above wirings. The parasitic capacity, however, can be decreased to be almost negligible by forming an organic resin film having a small specific inductivity as the second interlayer insulating film maintaining a thickness of from 1.5 to 2.5 μm.

Therefore, what becomes the most serious hindrance in applying the invention to the EL display device having a pixel unit of a large area, is the wiring resistance in the data wirings and in the gate wirings. It is, of course, allowable to divide the data signal-side drive circuit into plural sections to arrange them in parallel, or to provide the data signal-side drive circuit and the gate signal-side drive circuit with the pixel unit sandwiched therebetween and send signals from both directions in order to substantially decrease the operation frequency of the drive circuits. In this case, however, there arouses another problem that the drive circuits occupy increased areas.

Therefore, minimizing the wiring resistance of the gate wirings relying on the structure of this Example is very effective in putting the invention into practice. In this Example, the pixel structure shown in FIG. 17 in no way limits the invention but simply represents a preferred example. Besides, this Example can be put into practice by being freely combined with any of the constitutions of Examples 1 to 3.

EXAMPLE 6

A data signal-side drive circuit that operates at a very high speed is necessary for executing the time-division gradation to divide a frame into n sub-frames. That is, it is desired to use a TFT that operates at a very high speed (high response speed). In this Example, use is made, as an active layer, of a silicon film that is very adapted to fabricating TFTs that operate at a very high speed.

A silicon film (polysilicon film in Example 1) having a particular crystalline structure is obtained by conducting the steps up to the step of FIG. 5(E) according to Example 1. In this silicon film, the crystalline grain boundaries are highly continuing and the directions of crystals are neatly oriented. By using this silicon film as active layer for the TFTs, there are obtained TFTs that operate at a very high speed. Described below are the results of observation of the silicon film that is prepared for use in the Example.

If viewed microscopically, the silicon film used in this Example has a crystalline structure in which plural needle-like or rod-like crystals (hereinafter referred to as rod-like crystals) are collectively arranged. This can be easily observed by TEM (transmission-type electron microscopic method).

Further, close observation of an electron-ray diffraction image of the silicon film with a spot diameter of 1.35 μm used in this Example shows clear diffraction spots corresponding to a plane {110} though it contains fluctuation to some extent, from which it is confirmed that the principal orientation surface has a plane {110} though it contains deviation to some extent: in the crystallographic axis.

Figure 19B:
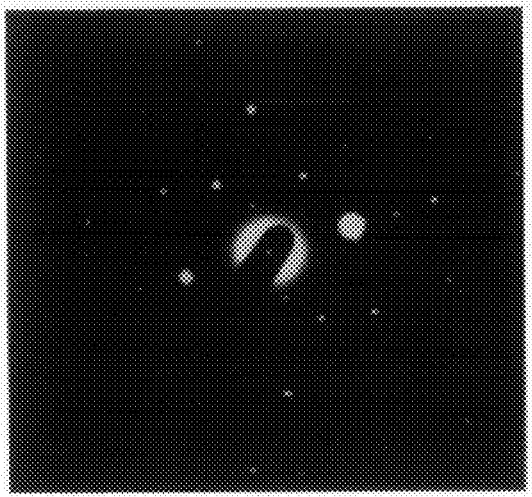

FIG. 19(A) is a photograph of an electron-ray diffraction image of when the silicon film used in the Example is irradiated with an electron ray of a spot diameter of 1.35 μm, and FIG. 19(B) is a photograph of an electron-ray diffraction image of when a conventional polysilicon film is irradiated with an electron ray under the same condition. In these photographs, the central portions are the sites irradiated with an electron ray (points irradiated with an electron ray).

FIG. 19(A) shows relatively clear diffraction spots corresponding to the plane {110}, whereas a glance of FIG. 19(B) shows irregular spots indicating that the orientation surface is irregular. A view of the electron-ray diffraction photographs helps readily distinguish the silicon film used in this Example over the conventional semiconductor film.

In the electron-ray diffraction image of FIG. 19(A), appearance of the diffraction spots corresponding to the plane {110} is obvious from the comparison with the electron-ray diffraction image of the single crystalline silicon wafer of {110} orientation. Further, while the diffraction spots of the single crystalline silicon wafer appear as sharp points, the diffraction spots of the silicon film used in this Example are expanding along circles in concentric with the point of irradiation of the electron ray as a center.

This is a feature of the silicon film used in the Example. The individual crystalline particles are oriented on the plane {110}. Therefore, if attention is given to a single crystalline particle, it is expected that a diffraction spot can be obtained similar to that of single crystalline silicon. In practice, however, plural crystalline particles are existing being collected together. Therefore, though the individual crystalline particles are oriented on the plane {110}, they slightly spin about their crystallographic axes, and points of diffraction corresponding to the crystalline particles appear in a plural number on a concentric circle. They are overlapped one upon the other and appear to be expanding.

However, the individual crystalline particles form crystalline grain boundaries that match very well as will be described later, and a slight spin about the crystallographic axes does not impair the crystallinity. It can therefore be said that the electron-ray diffraction image of the silicon film used in the invention has substantially no difference from the electron-ray diffraction image of the single crystalline silicon wafer of {110} orientation.

From the foregoing, it can be said that the silicon film used as an active layer for the TFTs of this Example is the one that shows an electron-ray diffraction image corresponding to the orientation {110}.

Next, described below are crystalline grain boundaries of the silicon film used in the invention. Though they are called crystalline grain boundaries for easy explanation, they may be considered to be interfaces between the crystalline particles and other crystalline particles derived therefrom (branched therefrom). In either case, they are called, in this specification, crystalline grain boundaries inclusive of the above interface.

The applicant has observed the crystalline grain boundaries formed by the individual rod-like crystals that are contacting to one another by HR-TEM (high-resolution transmission type electron microscopic method) and has confirmed continuity in the crystalline lattice on the crystalline grain boundaries. This can be easily confirmed from the fact that the lattice stripes that are observed are continuing on the crystalline grain boundaries.

The continuity of the crystal lattice on the crystalline grain boundaries stems from that the crystalline grain boundaries are the ones called "planar grain boundaries". The definition of the planar grain boundaries used in this specification has been disclosed in "Characterization of High-Efficiency Cast-Si Solar Cell Wafers by MBIC Measurement; Ryuichi Shimokawa and Yutaka, Hayashi, Japanese Journal of Applied Physics, Vol. 27, No. 5, pp. 751-758, 1988".

According to the above theory, the planar grain boundary includes a twin grain boundary, a special laminated layer defect, a special twisted grain boundary, etc. The planar grain boundary is electrically inactive, which is a feature. That is, despite it is a crystalline grain boundary, the planar grain boundary does not work as a trap that blocks the migration of carriers, and can be regarded to be not really existing.

In particular, when the crystallographic axis (axis perpendicular to the crystal plane) is an axis <110>, the twin grain boundary {211} and the twin grain boundary {111} are called corresponding grain boundaries of Σ3. The value Σ3 is a parameter which is an indication representing the degree of matching of the corresponding grain boundaries. It has been known that the smaller the value Σ3, the better the matching of the grain boundaries.

As a result of observing the silicon film used in the invention by TEM, it is learned that most of the crystalline grain boundaries are the corresponding grain boundaries of Σ3. This is judged from the fact that when the plane azimuth of the two crystalline particles is {110} in the crystalline grain boundary formed between the two crystalline particles and when the angle subtended by a lattice stripe corresponding to a plane {111} is θ, then, the corresponding grain boundary of Σ3 is exhibited when θ=70.5°.

When θ=38.9°, the corresponding grain boundary becomes Σ9. There also exist such other crystalline grain boundaries.

Such corresponding grain boundaries are formed only among the crystalline grains of the same plane azimuth. That is, the silicon film used in the invention has plane azimuths which are nearly oriented to be roughly {110}, from which it can be said that the corresponding grain boundaries are formed over a wide range.

Such a crystalline structure (correctly, a structure of the crystalline grain boundary) indicates that two different crystalline particles are joined in very good match with each other on the crystalline grain boundary. That is, the crystal lattices are continuing in the crystalline grain boundary, and a trap level due to crystal defect is very unlikely to be established. It can therefore be regarded that the crystalline grain boundary does not substantially exist in the thin semiconductor film having such a crystal structure.

Upon effecting the heat treatment at 700 to 1150° C. in the step of forming the silicon film used in the invention, further, it has been confirmed through the TEM observation that defects (defects in the laminated layers, etc.) present in the crystalline particles are almost all extinguished. This is obvious from the fact that the number of defects are greatly decreasing before and after the step of heat treatment.

The difference in the number of defects appear as a difference in the spin density through the electron spin resonance (ESR) analysis. At present, it has been learned that the spin density of the silicon film used in the invention is at least not larger than $5 \times 10^{17}$ spins/cm$^3$ (preferably, nor larger than $3 \times 10^{17}$ spins/cm$^3$). The measured value, however, is close to a limit of detection by the existing measuring apparatus, and it is expected that the practical spin density is much lower.

For further detailed description of the silicon film used in the invention, reference should be made to Japanese Patent Applications Nos. 044659/1998, 152316/1998, 152308/1998 and 152305/1998 filed by the present applicant.

Further, the TFT prepared by using the silicon film used in the invention as an active layer exhibits electric characteristics comparable to those of a MOSFET. The following data are obtained from the TFT (active layer is 30 nm thick and gate insulating film is 100 nm thick) prepared by the present applicant.

(1) A sub-threshold coefficient which is an index of the switching performance (swiftness for changing over on/off operation) is as small as from 60 to 100 mV/decade (typically, from 60 to 85 mV/decade) in both the n-channel TFT and the p-channel TFT.

(2) The electric-field mobility ($\mu_{FE}$) which is an index of the operation speed of the TFT is as large as from 200 to 650 cm$^2$/Vs (typically, from 300 to 500 cm$^2$/Vs) in the n-channel TFT, and is as large as from 100 to 300 cm$^2$/Vs (typically, from 150 to 200 cm$^2$/Vs) in the p-channel TFT.

(3) The threshold voltage ($V_{th}$) which is an index of the operation voltage of the TFT is as small as from −0.5 to 1.5 V in the n-channel TFT and from −1.5 to 0.5 V in the p-channel TFT.

As described above, it has been confirmed that very excellent switching characteristics and high-speed operation characteristics can be realized. With a ring oscillator fabricated by using the above TFTs, further, an oscillation frequency of a maximum of about 1 GHz could be accomplished. The ring oscillator that was fabricated was constituted as follows:

Number of stages: 9 stages
Thicknesses of gate insulating films of TFT: 30 nm and 50 nm
Gate length (channel length) of TFT: 0.6 μm Further, the shift register was fabricated to make sure the operation frequency. As a result, output pulses of an operation frequency of 100 MHz were obtained by a shift register having a gate insulating film of a thickness of 30 nm, a gate length of 0.6 μm, a power-source voltage of 5 V and the number of stages of 50 stages.

The astonishing data of the ring oscillator and of the shift register indicate that the TFT having the silicon film of the invention as an active layer, exhibits operation performance comparable to, or superior to, that of the MOSFET that uses single crystalline silicon.

By using the silicon film of the invention, as described above, it is allowed to form a TFT that operates at a very high speed and to realize drive circuits that operate at a high speed by forming the drive circuits using such TFTs. That is, the above-mentioned TFTs can be very effectively used for putting the invention into practice.

Besides, the TFTs using the silicon film of the invention can be effectively used not only in the drive circuits but also for the switching TFTs and current control TFTs that are arranged in the pixel unit. An increase in the operation speed shortens the time for writing data into the holding capacity, and increases the response speed for emitting light of the EL element, making it possible to provide more bright and vivid picture.

EXAMPLE 7

Figure 20:
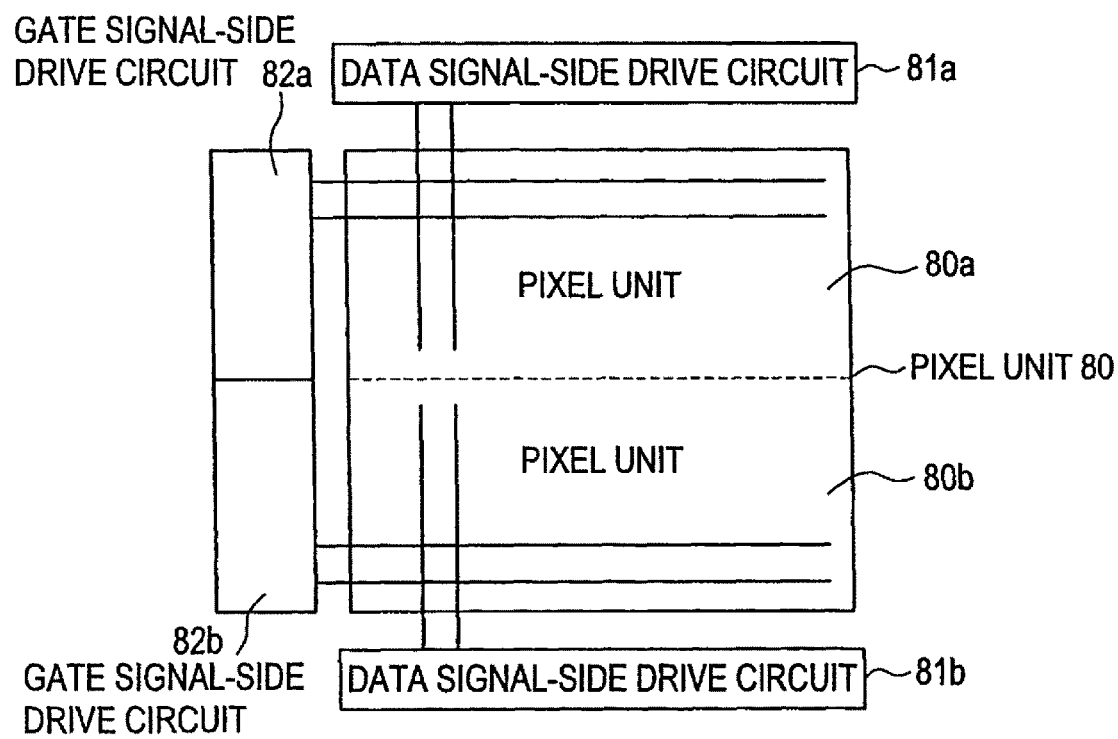
FIG. 20 is a diagram illustrating a circuit constitution of the EL display device.

Example 6 has dealt with the formation of drive circuits by using TFTs that can be driven at a very high speed. This Example deals with a method of driving the pixel unit that is effective in putting the invention into practice, with reference to FIG. 20.

In this embodiment, the pixel unit 80 is divided into two pixel units 80*a* and 80*b*, and the pixel unit 80*a* is driven by a data signal-side drive circuit 81*a* and a gate signal-side drive circuit 82*a*, and the pixel unit 80*b* is driven by a data signal-side drive circuit 81*b* and a gate signal-side drive circuit 82*b*.

In this case, if the pixel units 80*a* and 80*b* are simultaneously driven at the same frequency, the operation frequencies of the data signal-side drive circuits 81*a*, 81*b* and of the gate signal-side drive circuits 82*a*, 82*b* can be halved. This makes it possible to broaden the operation margin and to obtain an EL display device featuring high reliability consuming small amounts of electric power.

If the operation frequency is not changed, then, the address period can be halved and the sustain period can be lengthened correspondingly. That is, the light-emitting time can be maintained long and the brightness of the picture can be enhanced.

A picture can be displayed by the pixel units 80*a* and Bob in combination, or different pictures can be displayed by the pixel units 80*a* and 80*b*. For example, either one may display a still picture and the other one may display a dynamic picture. That is, a dynamic picture and a still picture may be displayed in a mixed manner by the pixel unit 80.

In this embodiment, the pixel unit is divided into two. The pixel unit, however, may be divided into plural pixel units. Further, the constitution of this Example can be put into practice being freely combined with any of the constitutions of Examples 1 to 6.

EXAMPLE 8

Figure 21:
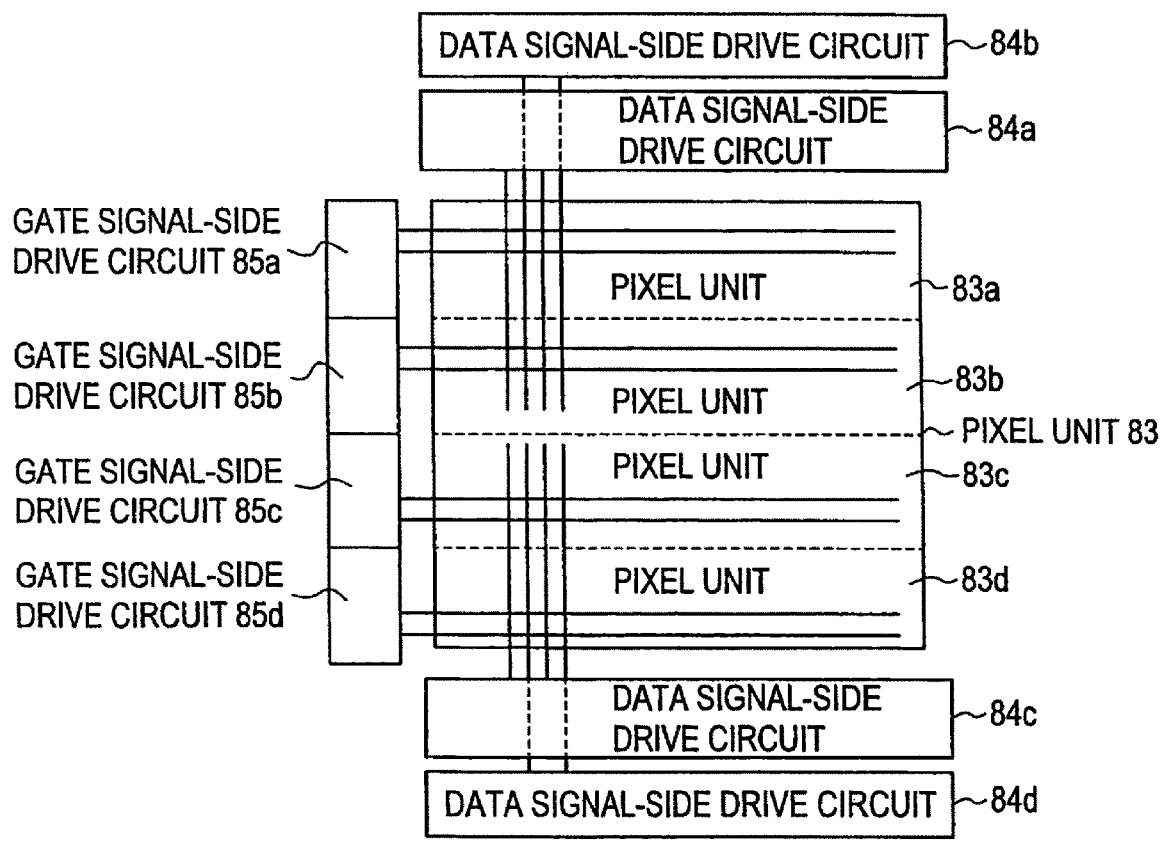
FIG. 21 is a diagram illustrating a circuit constitution of the EL display device.

This Example deals with a method of driving the pixel unit that is effective in putting the invention into practice, which is different from the driving method of FIG. 7. The description refers to FIG. 21.

In this Example, the pixel unit 83 is divided into four pixel units 83*a* to 83*d*, and are driven by the data signal-side drive circuits 84*a* to 84*d* and by the gate signal-side drive circuits 85*a* to 85*d*.

In this case, the pixel units 83*a* to 83*d* are simultaneously driven at the same frequency to lower the operation frequencies of the data signal-side drive circuits 84*a* to 84*d* and of the gate signal-side drive circuits 85*a* to 85*d* down to one-fourth. Therefore, the operation margin is further broadened than the case of Example 7, making it possible to obtain an EL display device which is highly reliable consuming a decreased amount of electric power.

If the operation frequency is not changed, the address period can be shortened to one-fourth and the sustain period can be lengthened correspondingly. That is, the light-emitting time can be lengthened to enhance the brightness of the picture.

Further, a picture can be displayed by the combination of all pixel units 83a to 83d. Besides, a picture can be displayed by the pixel units 83a, 83b, and another picture can be displayed by the pixel units 83c, 83d; i.e., two different pictures can be simultaneously displayed. A still picture may be displayed by the pixel units 83a, 83b, and a dynamic-picture may be displayed by the pixel units 83c, 83d; i.e., a dynamic picture and a static picture may be displayed in a mixed manner by the pixel unit 83.

In this embodiment, the pixel unit is divided into four. The pixel unit, however, may be divided into plural pixel units. Further, the constitution of this Example can be put into practice being freely combined with any of the constitutions of Examples 1 to 6.

EXAMPLE 9

Figure 22:
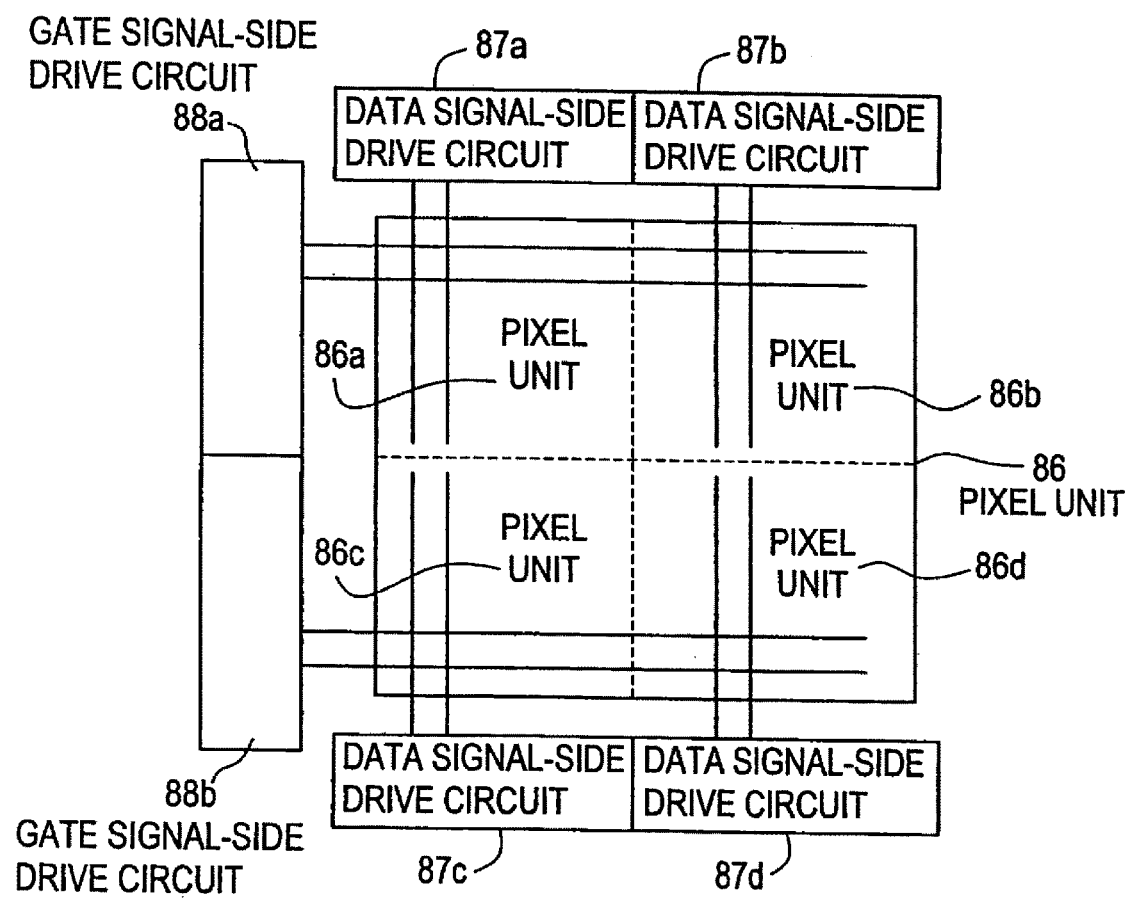
FIG. 22 is a diagram illustrating a circuit constitution of the EL display device.

This Example deals with a method of driving the pixel unit that is effective in putting the invention into practice, which is different from the driving method of FIG. 8. The description refers to FIG. 22.

In this Example, the pixel unit 86 is divided into four pixel units 86a to 86d, the pixel unit 86a is driven by a data signal-side drive circuit 87a and a gate signal-side drive circuit 88a, and the pixel unit 86b is driven by a data signal-side drive circuit 87b and a gate signal-side drive circuit 88a. Similarly, the pixel unit 86c is driven by a data signal-side drive circuit 87c and a gate signal-side drive circuit 88b, and the pixel unit 86d is driven by a data signal-side drive circuit 87d and a gate signal-side drive circuit 88b.

In this case, the pixel units 86a to 86d are simultaneously driven at the same frequency to lower the operation frequencies of the data signal-side drive circuits 87a to 87d down to one-fourth and to lower the operation frequencies of the gate signal-side drive circuits 88a and 88b down to one-half. Therefore, the operation margin is further broadened than the case of Example 7, making it possible to obtain an EL display device which is highly reliable consuming a decreased amount of electric power.

If the operation frequency is not changed, the address period can be shortened to one-fourth and the sustain period can be lengthened correspondingly. That is, the light-emitting time can be lengthened to enhance the brightness of the picture.

Further, a picture can be displayed by the combination of all pixel units 86a to 86d, or different pictures can be displayed by the pixel units 86a to 86d. As a matter of course, a picture can be displayed by the pixel units 86a to 86c, and a different picture can be displayed by the pixel units 86d. Further, a dynamic picture and a static picture may be displayed in a mixed manner by the pixel unit 86.

The constitution of this embodiment can be further put into practice by being freely combined with any of the constitutions of Examples 1 to 6.

EXAMPLE 10

In the constitution of Example 1 shown in FIG. 2, it is effective if a material having a high heat-radiating effect is used as the underlying film 12 formed between the active layer and the substrate 11. In particular, the current control TFT flows a relatively large current over an extended period of time and generates heat and is, hence, subject to be deteriorated by heat which it has generated. In such a case, the underlying film having heat-radiating effect like in this embodiment, suppresses the deterioration of TFT caused by heat.

As a light-transmitting material having heat-radiating effect, there can be exemplified an insulating film containing at least one element selected from B (boron), C (carbon) and N (nitrogen) and at least one element selected from Al (aluminum), Si (silicon) and P (phosphorus).

For example, there can be used a nitride of aluminum as represented by aluminum nitride (AlxNy), a carbide of silicon as represented by silicon carbide (SixCy), a nitride of silicon as represented by silicon nitride (SixNy), a nitride of boron as represented by boron nitride (BxNy), and a phosphide of boron as represented by boron phosphide (BxPy). An oxide of aluminum as represented by aluminum oxide (AlxOy) can be one of the preferred materials exhibiting excellent light-transmitting property and heat conductivity of 20 $Wm^{-1}K^{-1}$. In the above light-transmitting material, x and y are arbitrary integers.

It is also allowable to combine the above compound with any other element. For example, nitrogen may be added to aluminum oxide to use it as aluminum oxynitride which is represented by AlNxOy. This material, too, exhibits not only the heat-radiating effect but also the effect for preventing the infiltration of water and alkali metals. In the above aluminum oxynitride, x and y are arbitrary integers.

It is further allowable to use the material disclosed in Japanese Patent Laid-Open No. 90260/1987. In short, it is allowable to use a insulating film containing Si, Al, N, or M (where M is at least one rare earth element, preferably, at least one element selected from Ce (cerium), Yb (ytterbium), Sm (samarium), Er (erbium), Y (yttrium), La (lanthanum), Gd (gadolinium), Dy (dysprosium) and Nd (neodium)). These materials, too, exhibit not only the heat-radiating effect but also the effect for preventing the infiltration of water and alkali metals.

It is further allowable to use at least a thin diamond film or a carbon film including amorphous carbon film (particularly, the one having property close to that of diamond, called diamond-like carbon). They have very high heat conductivities and can be very effectively used as heat-radiating layers. The film, however, becomes brownish and loses transmission factor as its thickness increases. It is therefore desired that the film has a thickness as small as possible (preferably, 5 to 100 nm).

The thin film of the above material exhibiting the heat-radiating effect may be used alone or may be used together with an insulating film containing silicone being laminated one upon the other.

The constitution of this Example can be put into practice by being freely combined with any of the constitutions of Examples 1 to 9.

EXAMPLE 11

In Example 1, an organic EL material was preferably used as the EL layer. However, the invention can be put into practice even by using an inorganic EL material. However, the currently available inorganic EL materials require very high drive voltages, and it becomes necessary to use TFTs having a breakdown voltage that withstands such drive voltages.

If an inorganic EL material that requires a low drive voltage is developed in the future, then, this invention can be applied thereto.

Further, the constitution of this Example can be freely combined with any of the constitutions of Examples 1 to 10.

EXAMPLE 12

The active matrix-type EL display device (EL module) fabricated by embodying the invention emits light by itself and can be favorably watched in a bright place compared to the liquid crystal display devices. Therefore, the device of the invention can be used as a display unit of the EL display (display incorporating the EL module) of the type that is directly watched. Examples of the EL display may include a monitor of a personal computer, a monitor for receiving TV broadcast, a monitor of advertisement display, etc.

In addition to the above EL displays, the device of the invention can be used as a display of any electronic equipment that includes the display unit as a component.

Examples of the electronic device include an EL display, a video camera, a digital camera, a head-mounted display, a car navigation, a personal computer, a portable data terminal (mobile computer, cellular phone, electronic book, etc.), and a picture reproducing apparatus equipped with a recording medium (concretely, an apparatus equipped with a display which reproduces a recording medium such as compact disk (CD), laser disk (LD) or digital video disk (DVD), and displays the picture). FIG. 18 illustrates examples of the electronic equipment.

Figure 18A:
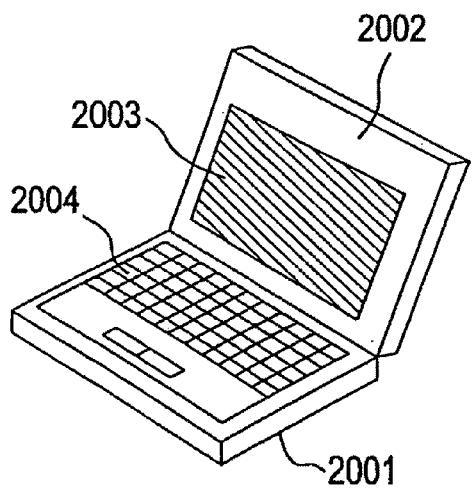
FIGS. 18(A) to 18(E) are views illustrating concrete examples of the electronic device.

FIG. 18(A) shows a personal computer which includes a main body 2001, a housing 2002, a display unit 2003 and a keyboard 2004. The invention can be applied to the display unit 2003.

Figure 18B:
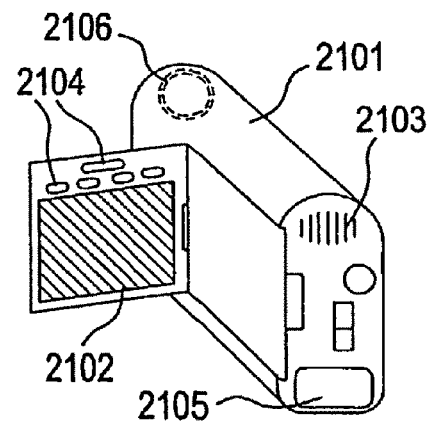

FIG. 18(B) shows a video camera which includes a main body 2101, a display unit 2102, a voice input unit 2103, an operation switch 2104, a battery 2105 and a picture unit 2106. The invention can be applied to the display unit 2102.

Figure 18C:
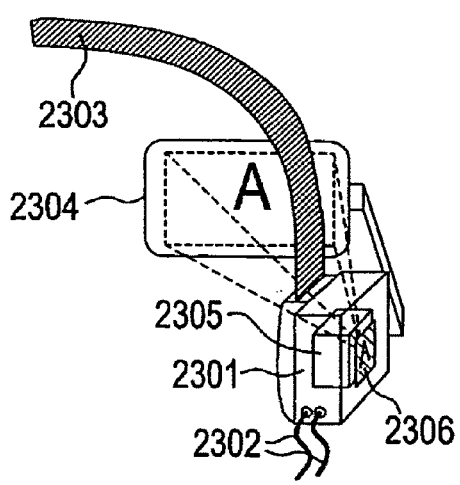

FIG. 18(C) shows a portion (right side) of a head-mounted EL display which includes a main body 2301, a signal cable 2302, a head-fixed band 2303, a display monitor 2304, an optical system 2305 and a display unit 2306. The invention can be applied to the display device 2306.

Figure 18D:
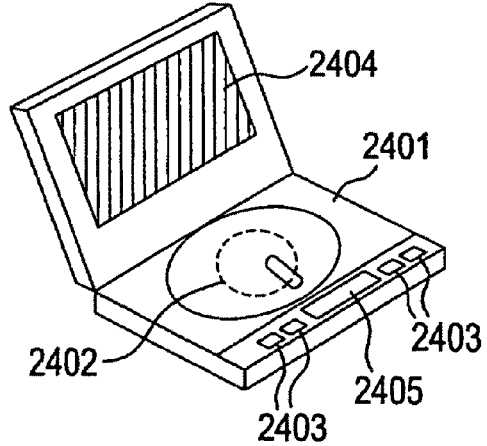

FIG. 18(D) shows a picture reproducing apparatus (concretely, a DVD reproducing apparatus) equipped with a recording medium, which includes a main body 2401, a recording medium (CD, LD or DVD) 2402, an operation switch 2403, a display unit (a) 2404 and a display unit (b) 2405. The display unit (a) chiefly displays the picture data, and the display unit (b) chiefly displays the character data. The invention can be adapted to these display devices (a) and (b). As the picture reproducing apparatus equipped with the recording medium, there can be exemplified a CD reproducing apparatus and game equipment to which the invention is adapted.

Figure 18E:
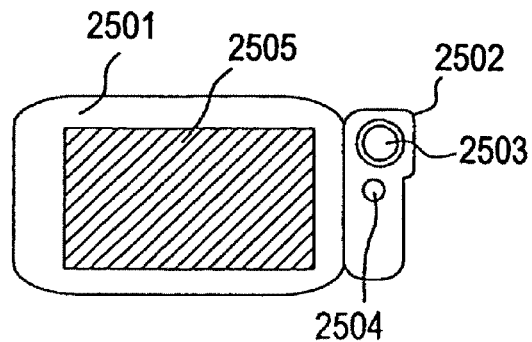

FIG. 18(E) shows a portable (mobile) computer which includes a main body 2501, a camera unit 2502, a picture unit 2503, an operation switch 2504 and a display unit 2505. The invention can be adapted to the display unit 2505.

If an EL material exhibiting a high luminance becomes available in the future, then, the display unit can be employed for a projector of the front type or the rear type.

As described above, the present invention finds a very wide range of applications and in which the invention can be adapted to electronic equipment of any kind of field. Besides, the electronic equipment of the embodiment can be realized by using the constitution of any combination of Examples 1 to 11.

EXAMPLE 13

In this Example, the resistance of the resistor provided between the current control TFT and the EL element is determined according to the specifications of the practical EL display device (monochromatic display).

First, an EL material is determined that is used as the EL layer. In this Example, a TPD is formed maintaining a thickness of 50 nm as a positive hole transport layer and an Alq is formed maintaining a thickness of 50 nm as an EL layer on the anode of ITO and, then, a cathode of MgAg is formed thereon to fabricate an EL element. Here, the EL layer is deposited on the whole surfaces of the striped ITO pattern (2 mm wide), and striped MgAg electrode (2 mm wide) is formed to intersect the ITO pattern at right angles.

Figure 23A:
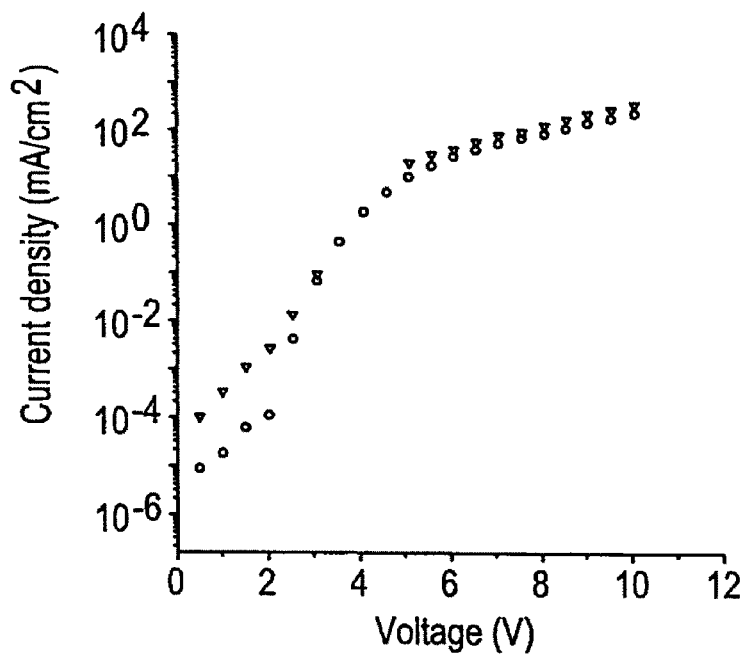
FIGS. 23(A) and 23(B) are diagrams showing electric characteristics of the EL element.
Figure 23B:
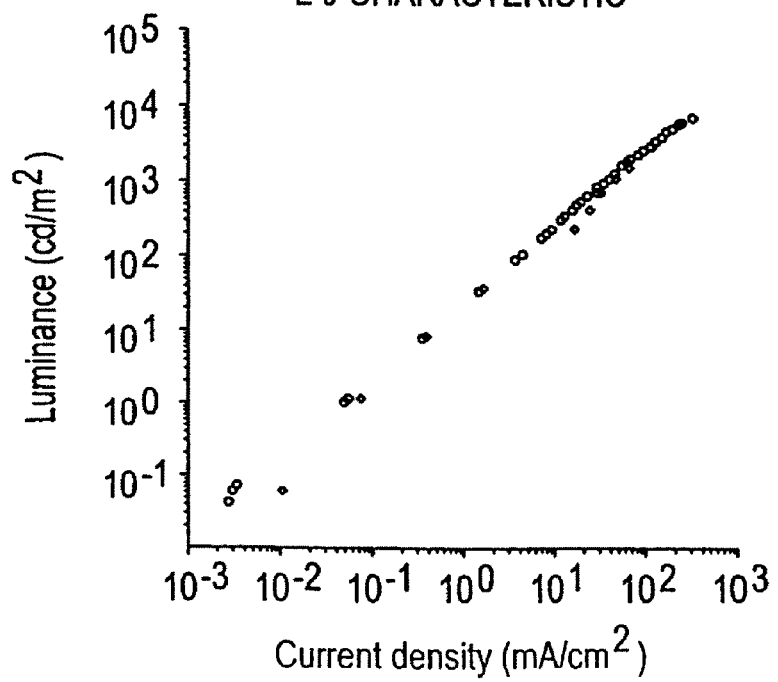

FIG. 23(A). shows a relationship between the drive voltage and the current density of the EL element that is fabricated. FIG. 23(B) shows a relationship between the current density and the luminance of emitted light. The EL element of this Example exhibits a peak of light emission at the wavelength of near 524 nm, and the coordinate of chromaticity is x=0.30, y=0.57.

According to FIG. 23(B), a current density of about 100 $MA/cm^2$ is necessary for accomplishing the luminance of 5000 $cd/m^2$. Here, if an EL display device is considered having a pixel unit of a diagonal of 5 inches, in which square pixels of a side of about 156 μm are arranged in the form of a matrix, then, a current of about 24 μA is necessary per a pixel.

Referring to FIG. 23(A), the EL material used in the Example permits a current to flow at a current density of 100 $MA/cm^2$ when a voltage of 10 V is applied. When the voltage of 10 V is applied, therefore, a resistance of about 420 kΩ is necessary for stably flowing a current of about 24 μA.

Therefore, if a resistor having a resistance of 420 kΩ is provided as the resistor 109 shown in FIG. 1(B), then, a constant current of about 24 μA can be stably supplied to the EL element 110 at all times. As a result, the luminance of emitted light of about 5000 $cd/m^2$ can be accomplished to display a bright picture.

To lengthen the life of the EL layer, the resistance of the resistor may be further increased to suppress the current that flows into the EL element. In this case, however, the luminance of emitted light slightly drops. If, for example, the luminance of about 1000 $cd/m^2$ may suffice, then, the required current density is about 30 $mA/cm^2$ and the drive voltage for the EL element is about 6 V. Therefore, a current of about 7.3 μA may flow per a pixel. Accordingly, the resistor of about 820 kΩ is necessary.

Thus, the resistance of the resistor needed for the invention can be easily derived by using parameters of the EL display device.

The invention makes it possible to obtain an active matrix-type EL display device capable of producing a vivid multi-gradation color display without affected by variance in the properties of the TFTs. Concretely speaking, a resistor is provided between the current control TFT and the EL element in the pixel unit, and the current is determined by the resistance of the resistor. Then, the time-division gradation display is effected by digital signals to obtain a highly fine picture maintaining good color reproducibility without defect in the gradation that is caused by variance in the properties of the current control TFTs.

Besides the TFTs of an optimum structure are formed on the substrate to meet performance required by the circuits and elements, to thereby realize an active matrix-type EL display device which is highly reliable.

Upon providing the active matrix-type EL display device as a display unit, it is made possible to produce electronic devices of high performance featuring good picture quality and high reliability.

What is claimed is:
1. A display device comprising:
a TFT provided over a substrate;
an EL element provided over the substrate; and
a resistor comprising a first semiconductor layer, wherein the EL element is electrically connected to one of a source and a drain of the TFT through at least the resistor, wherein an amount of light emitted from the EL element varies depending on an amount of direct current flowing through the EL element, wherein the TFT includes a second semiconductor layer, and wherein the first and the second semiconductor layers are same material.

2. The display device according to claim 1, wherein the resistor has a resistance of 1 kΩ to 50 MΩ.

3. The display device according to claim 1, wherein the TFT is a top-gate transistor.

4. The display device according to claim 1, wherein the EL element is an organic EL element.

5. The display device according to claim 1, wherein the first semiconductor layer comprises an impurity element.

6. The display device according to claim 1 further comprising a light-shielding film provided over the first semiconductor layer.

7. A display device comprising:
a first TFT provided over a substrate;
a second TFT provided over the substrate, wherein a gate of the second TFT is electrically connected to one of a source and a drain of the first TFT;
an EL element provided over the substrate; and
a resistor comprising a first semiconductor layer,
wherein the EL element is electrically connected to one of a source and a drain of the second TFT through at least the resistor,
wherein an amount of light emitted from the EL element varies depending on an amount of direct current flowing through the EL element,
wherein the second TFT includes a second semiconductor layer, and
wherein the first and the second semiconductor layers are same material.

8. The display device according to claim 7, wherein the resistor has a resistance of 1 kΩ to 50 MΩ.

9. The display device according to claim 7, wherein the first TFT and the second TFT are top-gate transistors.

10. The display device according to claim 7, wherein the first TFT and the second TFT are n-channel type transistors.

11. The display device according to claim 7, wherein the EL element is an organic EL element.

12. The display device according to claim 7, wherein a channel width of the second TFT is wider than a channel width of the first TFT.

13. The display device according to claim 7, wherein the first semiconductor layer comprises an impurity element.

14. The display device according to claim 7 further comprising a light-shielding film provided over the first semiconductor layer.

15. A display device comprising:
a first line provided over a substrate;
a second line provided perpendicular to the first line;
a third line provided in parallel with the second line;
a first TFT provided over the substrate, wherein a gate of the first TFT is electrically connected to the first line, and one of a source and a drain of the first TFT is electrically connected to the second line;
a second TFT provided over the substrate, wherein a gate of the second TFT is electrically connected to the other of the source and the drain of the first TFT, one of a source and a drain of the second TFT is electrically connected to the third line;
an EL element provided over the substrate; and
a resistor comprising a first semiconductor layer,
wherein the EL element is electrically connected to the other of the source and the drain of the second TFT through at least the resistor,
wherein an amount of light emitted from the EL element varies depending on an amount of direct current flowing through the EL element,
wherein the second TFT includes a second semiconductor layer, and
wherein the first and the second semiconductor layers are same material.

16. The display device according to claim 15, wherein the resistor has a resistance of 1 kΩ to 50 MΩ.

17. The display device according to claim 15, wherein the first TFT and the second TFT are top-gate transistors.

18. The display device according to claim 15, wherein the first TFT and the second TFT are n-channel type transistors.

19. The display device according to claim 15, wherein the EL element is an organic EL element.

20. The display device according to claim 15, wherein a channel width of the second TFT is wider than a channel width of the first TFT.

21. The display device according to claim 15, wherein the first semiconductor layer comprises an impurity element.

22. The display device according to claim 15 further comprising a light-shielding film provided over the first semiconductor layer.

23. A display device comprising:
a first TFT provided over a substrate;
a second TFT comprising a first semiconductor layer provided over the substrate, wherein a gate of the second TFT is electrically connected to one of a source and a drain of the first TFT;
an EL element provided over the substrate; and
a resistor comprising a second semiconductor layer,
wherein the EL element is electrically connected to one of a source and a drain of the second TFT through at least the resistor,
wherein the first semiconductor layer and the second semiconductor layer are same material, and
wherein the first semiconductor layer is an LDD region.

24. The display device according to claim 23, wherein the resistor has a resistance of 1 kΩ to 50 MΩ.

25. The display device according to claim 23, wherein the first TFT and the second TFT are top-gate transistors.

26. The display device according to claim 23, wherein the first TFT and the second TFT are n-channel type transistors.

27. The display device according to claim 23, wherein the EL element is an organic EL element.

28. The display device according to claim 23, wherein a channel width of the second TFT is wider than a channel width of the first TFT.

29. The display device according to claim 23, wherein the first semiconductor layer and the second semiconductor layer comprises the same impurity element.

30. The display device according to claim 23 further comprising a light-shielding film provided over the second semiconductor layer.

* * * * *